(12) United States Patent
Huang et al.

(10) Patent No.: US 11,251,305 B2
(45) Date of Patent: Feb. 15, 2022

(54) FIN FIELD EFFECT TRANSISTOR DEVICE STRUCTURE AND METHOD FOR FORMING THE SAME

(71) Applicant: Taiwan Semiconductor Manufacturing Co., Ltd., Hsinchu (TW)

(72) Inventors: Lin-Yu Huang, Hsinchu (TW); Li-Zhen Yu, New Taipei (TW); Chia-Hao Chang, Hsinchu (TW); Cheng-Chi Chuang, New Taipei (TW); Yu-Ming Lin, Hsinchu (TW); Chih-Hao Wang, Baoshan Township, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/808,770

(22) Filed: Mar. 4, 2020

(65) Prior Publication Data
US 2021/0126129 A1 Apr. 29, 2021

Related U.S. Application Data

(60) Provisional application No. 62/926,059, filed on Oct. 25, 2019.

(51) Int. Cl.
*H01L 29/78* (2006.01)
*H01L 27/088* (2006.01)
(Continued)

(52) U.S. Cl.
CPC ...... *H01L 29/7851* (2013.01); *H01L 27/0886* (2013.01); *H01L 29/41791* (2013.01);
(Continued)

(58) Field of Classification Search
CPC ..... H01L 21/823431; H01L 21/823475; H01L 21/76897; H01L 21/76877–76879; H01L 21/76829–76834; H01L 21/76841–76844; H01L 21/76814; H01L 21/76865; H01L 27/0886; H01L 27/1211; H01L 29/66795; H01L 29/785–7851; H01L 29/66515
See application file for complete search history.

(56) References Cited

U.S. PATENT DOCUMENTS 8,772,109 B2 7/2014 Colinge
8,785,285 B2 7/2014 Tsai et al.
(Continued)

*Primary Examiner* — Errol V Fernandes
*Assistant Examiner* — Jeremy J Joy
(74) *Attorney, Agent, or Firm* — Birch, Stewart, Kolasch & Birch, LLP

(57) ABSTRACT

A fin field effect transistor device structure includes a fin structure formed over a substrate. The structure also includes a gate structure formed across the fin structure. The structure also includes a cap layer formed over the gate structure. The structure also includes a contact structure formed over the gate structure penetrating through the cap layer. The structure also includes an isolation film formed over sidewalls of the contact structure. The isolation film is separated from the gate structure, and a bottom surface of the isolation film is below a top surface of the cap layer.

20 Claims, 30 Drawing Sheets

(51) Int. Cl.
*H01L 29/417* (2006.01)
*H01L 29/66* (2006.01)
*H01L 21/768* (2006.01)
*H01L 21/8234* (2006.01)
*H01L 21/28* (2006.01)

(52) U.S. Cl.
CPC .. *H01L 29/66795* (2013.01); *H01L 21/28247* (2013.01); *H01L 21/76834* (2013.01); *H01L 21/76844* (2013.01); *H01L 21/76865* (2013.01); *H01L 21/76879* (2013.01); *H01L 21/76897* (2013.01); *H01L 21/823431* (2013.01); *H01L 21/823475* (2013.01); *H01L 29/66515* (2013.01); *H01L 2029/7858* (2013.01)

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,508,818 B1* | 11/2016 | Basker | H01L 29/45 |
| 9,520,482 B1 | 12/2016 | Chang et al. | |
| 9,576,814 B2 | 2/2017 | Wu et al. | |
| 10,211,302 B2* | 2/2019 | Cheng | H01L 21/31053 |
| 10,388,770 B1* | 8/2019 | Xie | H01L 29/785 |
| 2005/0106887 A1* | 5/2005 | Chen | H01L 21/76897 438/706 |
| 2015/0108589 A1* | 4/2015 | Cheng | H01L 29/42368 257/411 |
| 2015/0357409 A1* | 12/2015 | Horak | H01L 21/28008 257/407 |
| 2017/0148799 A1* | 5/2017 | Basker | H01L 21/76897 |
| 2017/0278747 A1* | 9/2017 | Adusumilli | H01L 23/485 |
| 2018/0122919 A1* | 5/2018 | Park | H01L 29/66545 |
| 2018/0174904 A1* | 6/2018 | Hsieh | H01L 29/785 |
| 2018/0190809 A1* | 7/2018 | Huang | H01L 29/7851 |
| 2018/0337244 A1* | 11/2018 | Hsu | H01L 29/45 |
| 2018/0342618 A1* | 11/2018 | Chen | H01L 29/41783 |
| 2019/0006515 A1* | 1/2019 | Cheng | H01L 21/76877 |
| 2019/0096677 A1* | 3/2019 | Xie | H01L 29/41791 |
| 2019/0148537 A1* | 5/2019 | Chang | H01L 29/785 257/401 |
| 2019/0165176 A1* | 5/2019 | Wang | H01L 29/66545 |
| 2019/0259855 A1* | 8/2019 | Cheng | H01L 29/66636 |
| 2019/0296124 A1* | 9/2019 | Hsu | H01L 29/785 |
| 2019/0319105 A1* | 10/2019 | Cheng | H01L 27/088 |
| 2021/0082770 A1* | 3/2021 | Xie | H01L 21/823431 |

* cited by examiner

FIN FIELD EFFECT TRANSISTOR DEVICE STRUCTURE AND METHOD FOR FORMING THE SAME

CROSS REFERENCE TO RELATED APPLICATIONS

This application claims the benefit of U.S. Provisional Application No. 62/926,059, filed on Oct. 25, 2019, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-2I, 2J-1, 2J-2, 2J-3, 2K-1, 2K-2 are cross-sectional representations of various stages of forming a FinFET device structure, in accordance with some embodiments of the disclosure.

FIG. 2K-3 is a top view of a FinFET device structure, in accordance with some embodiments of the disclosure.

FIGS. 3A-3C, 3D-1, 3D-2, 3E-1, 3E-2 are cross-sectional representations of various stages of forming a modified FinFET device structure, in accordance with some embodiments of the disclosure.

FIG. 3E-3 is a top view of a modified FinFET device structure, in accordance with some embodiments of the disclosure.

DETAILED DESCRIPTION

Figure 1:
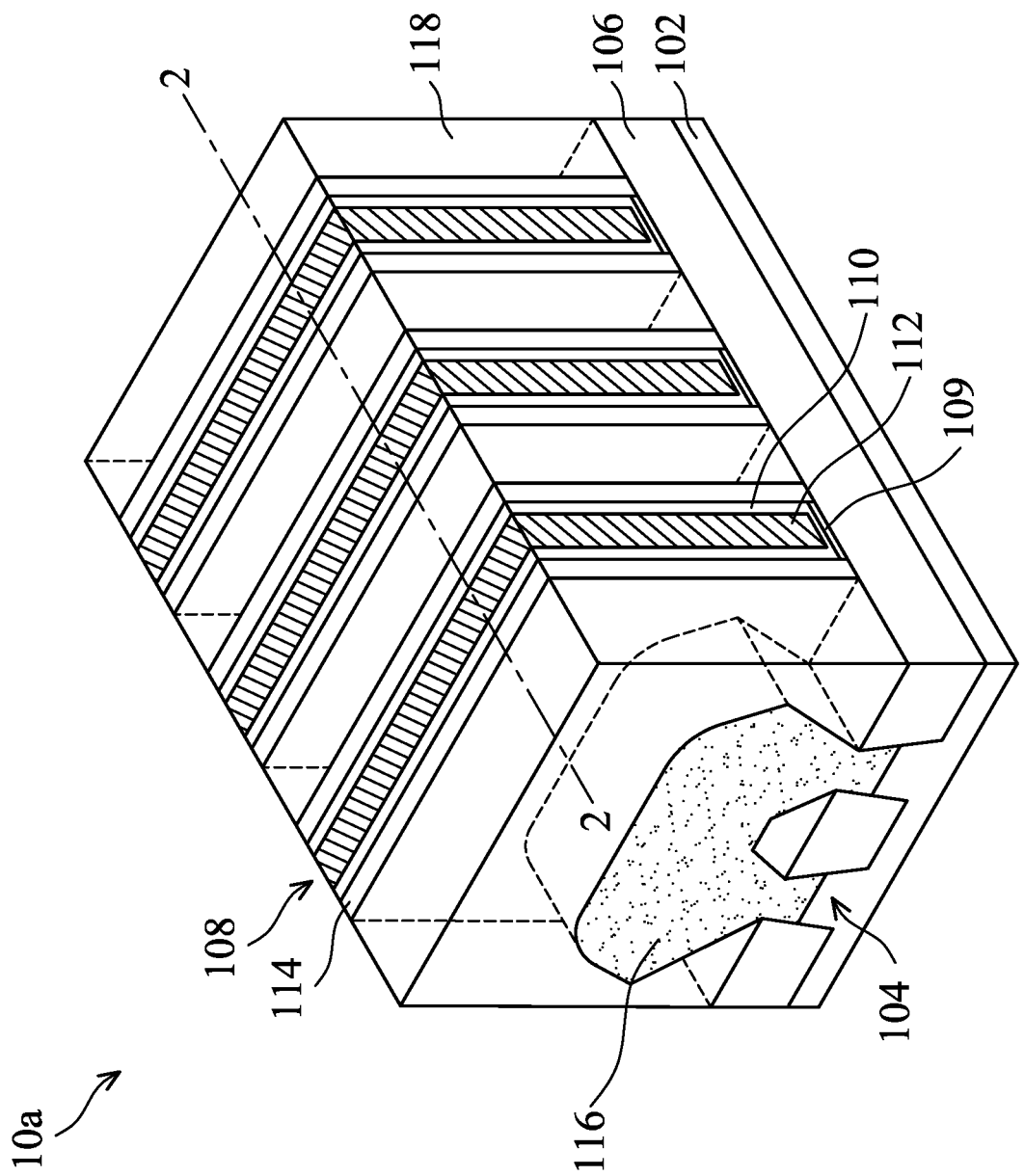
FIG. 1 is a perspective representation of a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial"

are still implied even without specific mention of the terms "around," "about," "substantial."

Embodiments for forming a fin field effect transistor (FinFET) device structure are provided. The method for forming the FinFET device structure may include selectively forming an isolation film over the sidewalls of the contact structure over the gate structure. The isolation film may prevent leakage current and reliability failure between the contact structure and its nearby conductive elements. In addition, without depositing the isolation film over the gate structure, the contact structure landing area may remain. Therefore, the contact interface resistance may remain.

FIG. 1 is a perspective representation of a FinFET device structure 10a, in accordance with some embodiments of the disclosure. FIGS. 2A-2I, 2J-1, 2J-2, 2J-3, 2K-1, 2K-2 are cross-sectional representations of various stages of forming a FinFET device structure 10a, in accordance with some embodiments of the disclosure. FIGS. 2A-2I, 2J-1, 2J-2, 2J-3, 2K-1 show cross-sectional representations taken along line 2-2 in FIG. 1.

Figure 2A:
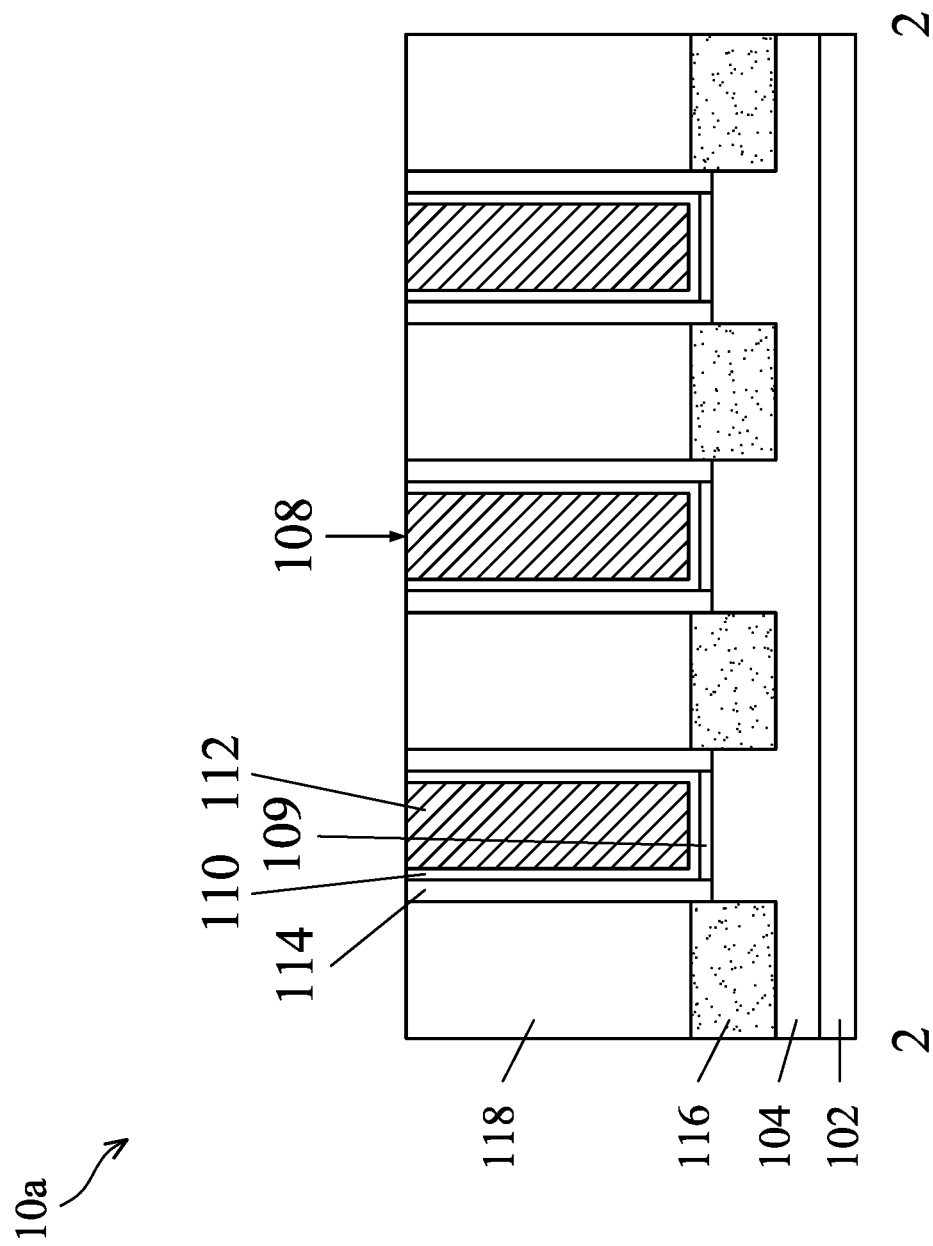

A substrate 102 is provided as shown in FIGS. 1 and 2A in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the substrate 102 includes an epitaxial layer. For example, the substrate 102 has an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, a pad layer may be blanketly formed over the substrate 102, and a hard mask layer may be blanketly formed over the pad layer (not shown). The pad layer may be a buffer layer between the substrate 102 and the hard mask layer. In addition, the pad layer may be used as a stop layer when the hard mask layer is removed. The pad layer may be made of silicon oxide. The hard mask layer may be made of silicon oxide, silicon nitride, silicon oxynitride, or another applicable material. The pad layer and the hard mask layer may be formed by deposition processes, such as a chemical vapor deposition (CVD) process, a high-density plasma chemical vapor deposition (HDPCVD) process, a spin-on process, a sputtering process, or another applicable process.

Afterwards, a photoresist layer may be formed over the hard mask layer (not shown). The photoresist layer may be patterned by a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. As a result, a patterned pad layer and a patterned hard mask layer may be obtained. Afterwards, the patterned photoresist layer may be removed.

Afterwards, an etching process is performed on the substrate 102 to form a fin structure 104 by using the hard mask layer as a mask as shown in FIGS. 1 and 2A in accordance with some embodiments. The etching process may be a dry etching process or a wet etching process. In some embodiments, the substrate 102 is etched by a dry etching process. The dry etching process may include using a fluorine-based etchant gas, such as $SF_6$, $C_xF_y$ (where x and y may be positive integers), $NF_3$, or a combination thereof. The etching process may be a time-controlled process, and continue until the fin structure 104 reaches a predetermined height.

Next, a liner layer may be conformally formed on the sidewalls and the top surface of the fin structure 104 (not shown). The liner layer may be used to protect the fin structure 104 from being damaged in the following processes (such as an anneal process or an etching process). In some embodiments, the liner layer is made of silicon nitride.

Next, an isolation layer 106 is formed to cover the fin structure 104 and the substrate 102 as shown in FIG. 1 in accordance with some embodiments, In some embodiments, the isolation layer 106 is made of silicon oxide, silicon nitride, silicon oxynitride, fluoride-doped silicate glass (FSG), or another low-k dielectric material. The isolation layer 106 may be deposited by a deposition process, such as a chemical vapor deposition (CVD) process such as low pressure CVD (LPCVD), plasma enhanced CVD (PECVD), or high density plasma CVD (HDP-CVD), high aspect ratio process (HARP), flowable CVD (FCVD), atomic layer deposition (ALD), a spin-on-glass process, or another applicable process, or a combination thereof.

Afterwards, the isolation layer 106 may be planarized to expose the top surface of the patterned hard mask layer (not shown). The isolation layer 106 may be planarized by a chemical mechanical polishing (CMP) process. Afterwards, the patterned hard mask layer may be removed. The patterned hard mask layer may be removed by a wet etching process. The wet etching process may include using a phosphoric acid ($H_3PO_4$) etching solution.

Next, an etching process is performed on the isolation layer 106, as shown in FIGS. 1 and 2A in accordance with some embodiments. The etching process may be used to remove a portion of the liner layer and a portion of the isolation layer 106. As a result, the top portion of the fin structure 104 may be exposed and the remaining isolation layer 106 may surround the base portion of the fin structure 104. The remaining isolation layer 106 may be an isolation structure 106 such as a shallow trench isolation (STI) structure surrounding the base portion of the fin structure 104. The isolation structure 106 may be configured to prevent electrical interference or crosstalk.

Next, a gate structure 108 is formed over and across the fin structures 104, as shown in FIG. 1 in accordance with some embodiments. In some embodiments, the gate structure 108 includes an interfacial layer 109, a gate dielectric layer 110 and a gate electrode layer 112. In some embodiments, the gate dielectric layer 110 is a dummy gate dielectric layer and the gate electrode layer 112 is a dummy gate electrode layer. The dummy gate dielectric layer and the dummy gate electrode layer may be replaced by the following steps to form a real gate structure with a high-k dielectric layer and a metal gate electrode layer.

The interfacial layer 109 may include silicon oxide. The silicon oxide may be formed by an oxidation process (such as a dry oxidation process, or a wet oxidation process), deposition process (such as a chemical vapor deposition (CVD) process or an atomic layer deposition (ALD) process), other applicable processes, or a combination thereof. In some embodiments, the interfacial layer 109 may be thermally grown using a thermal oxidation process in oxygen-containing ambient or nitrogen-containing ambient (e.g. NO or $N_2O$).

The gate dielectric layer 110 may include silicon oxide. The silicon oxide may be formed by an oxidation process (e.g., a dry oxidation process, or a wet oxidation process), a chemical vapor deposition process, other applicable processes, or a combination thereof. Alternatively, the gate dielectric layer 110 may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, (Ba, Sr)$TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The gate electrode layer 112 may include polycrystalline-silicon (poly-Si), poly-crystalline silicon-germanium (poly-SiGe), metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), other applicable materials, or a combination thereof. The gate electrode layer 112 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Afterwards, an etching process may be performed on the gate dielectric layer 110 and the gate electrode layer 112 to form the gate structure 108 by using a patterned photoresist layer as a mask (not shown). The etching process may be a dry etching process or a wet etching process. In some embodiments, the gate dielectric layer 110 and the gate electrode layer 112 are etched by a dry etching process. The dry etching process may include using a fluorine-based etchant gas, such as $SF_6$, $C_xF_y$ (where x and y may be positive integers), $NF_3$, or a combination thereof. After the etching process, the top portion of the fin structure 104 may be exposed on the opposite sides of the gate structure 108.

Next, a pair of spacers 114 are formed on opposite sidewalls of the gate structure 108, as shown in FIGS. 1 and 2A in accordance with some embodiments. The spacers 114 may be made of silicon oxide, silicon nitride, silicon oxynitride, and/or dielectric materials. In some embodiments, the spacers 114 are formed by a chemical vapor deposition (CVD) process, a spin-on-glass process, or another applicable process.

Afterwards, the top portion of the fin structure 104 exposed on the opposite sides of the gate structure 108 may be removed by an etching process to form a recess (not shown). The etching process may be a dry etching process or a wet etching process. The fin structures 104 may be etched by a dry etching process. The dry etching process may include using a fluorine-based etchant gas, such as $SF_6$, $C_xF_y$ (where x and y may be positive integers), $NF_3$, or a combination thereof.

Next, a source/drain epitaxial structure 116 is formed in the recess over the fin structure 104 on opposite sides of the gate structure 108, as shown in FIGS. 1 and 2A in accordance with some embodiments. A strained material may be grown in the recess by an epitaxial (epi) process to form the source/drain epitaxial structure 116. In addition, the lattice constant of the strained material may be different from the lattice constant of the substrate 102. The source/drain epitaxial structure 116 may include Ge, SiGe, InAs, InGaAs, InSb, GaAs, GaSb, InAlP, InP, SiC, SiP, other applicable materials, or a combination thereof. The source/drain epitaxial structure 116 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

After the source/drain epitaxial structure 116 is formed, a first inter-layer dielectric (ILD) structure 118 is formed to cover the source/drain epitaxial structure 116, as shown in FIGS. 1 and 2A in accordance with some embodiments. In some embodiments, the first ILD structure 118 surrounds the fin structures 104 and the source/drain epitaxial structure 116.

The first ILD structure 118 may include multilayers made of multiple dielectric materials, such as silicon oxide, silicon nitride, silicon oxynitride, phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The first ILD structure 118 may be formed by chemical vapor deposition (CVD), spin-on coating, or other applicable processes.

Afterwards, a planarizing process is performed on the first ILD structure 118 until the top surface of the gate structure 108 is exposed, as shown in FIG. 1 in accordance with some embodiments. After the planarizing process, the top surface of the gate structure 108 may be substantially level with the top surfaces of the spacers 114 and the first ILD structure 118. The planarizing process may include a grinding process, a chemical mechanical polishing (CMP) process, an etching process, other applicable processes, or a combination thereof.

Figure 2B:
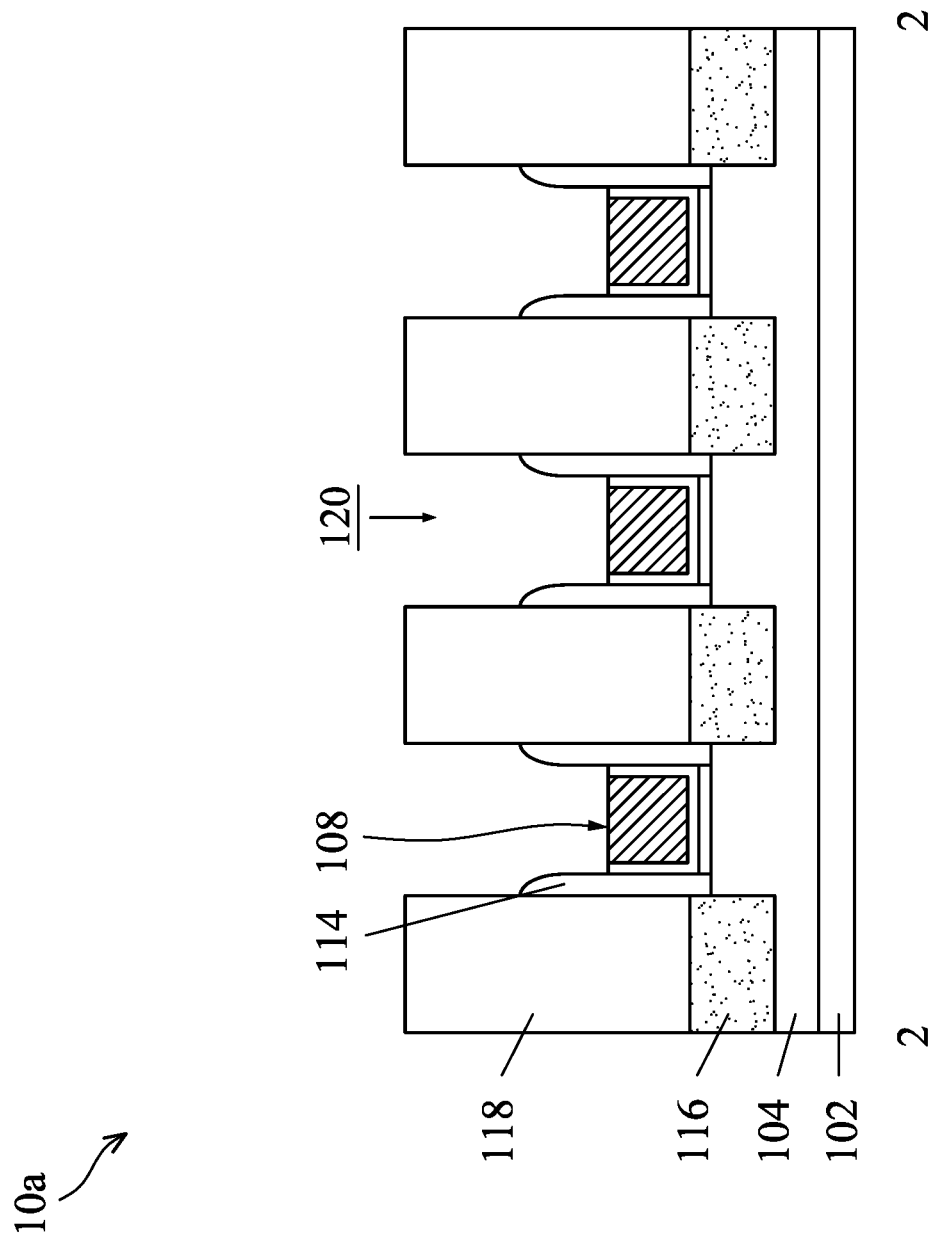

Next, the gate structure 108 and the spacers 114 are recessed to form a trench 120, as shown in FIG. 2B in accordance with some embodiments. The recessing process may include one or more etching processes, such as dry etching and/or wet etching. In some embodiments as shown in FIG. 2B, the top portion of the spacers 114 has a rounding profile after the trench 120 is formed.

Figure 2C:
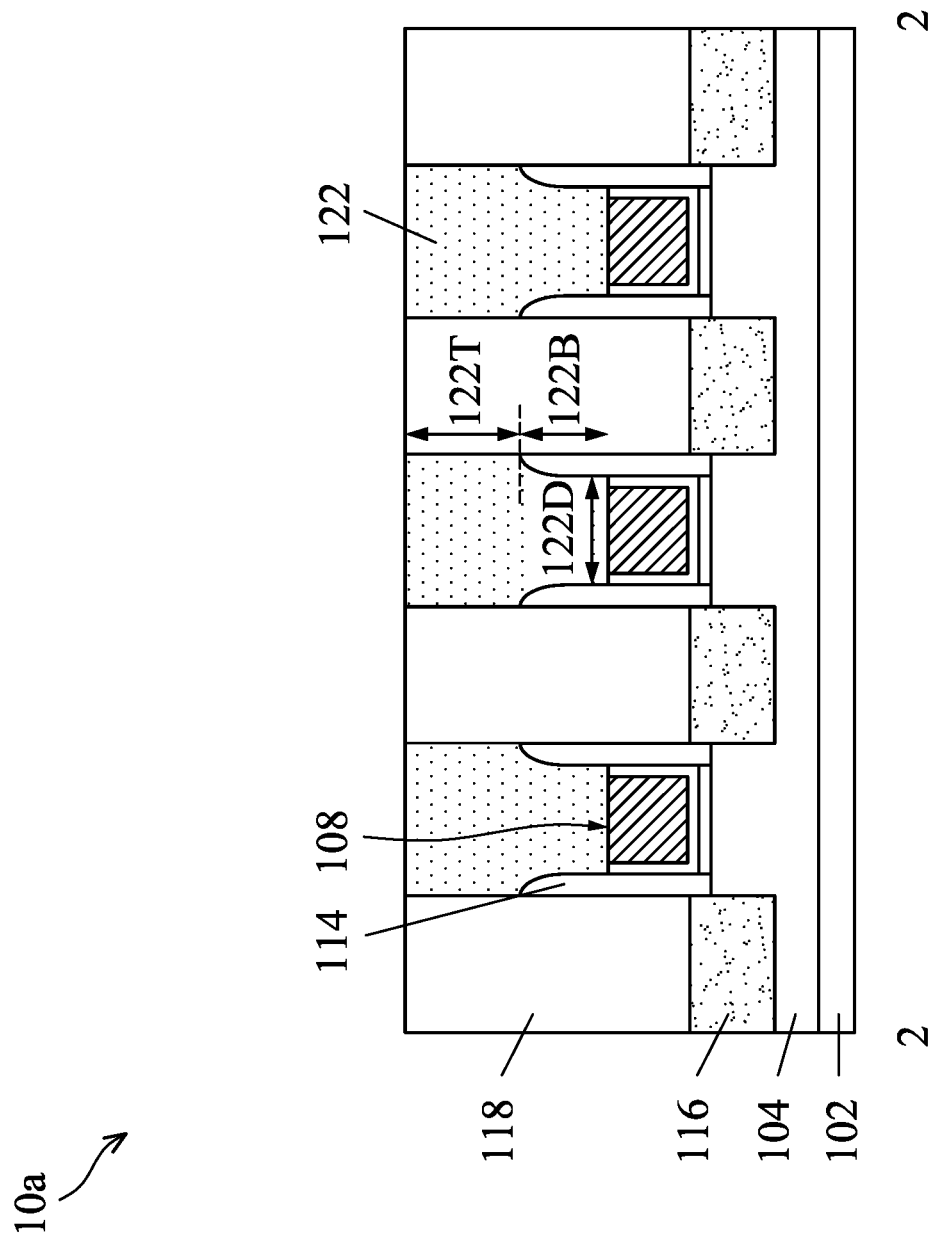

Next, a first cap layer 122 is formed in the trench 120 above the gate structure 108 and the spacers 114, as shown in FIG. 2C in accordance with some embodiments. The first cap layer 122 may provide isolation for subsequently formed contact structure and conductive elements nearby. The first cap layer 122 may be made of dielectric materials such as LaO, AlO, Si, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, other applicable materials, or a combination thereof. The first cap layer 122 may be deposited in the trench 120 by CVD (such as HDP-CVD, PECVD, or HARP), ALD, another suitable method, and/or a combination thereof. After the first cap layer 122 is deposited, a planarization process (e.g., a chemical mechanical polishing process or an etching back process) may optionally be performed to remove excess dielectric materials.

In some embodiments as shown in FIG. 2C, the bottom dimension 122D of the first cap layer 122 above the gate structure 108 is in a range of about 2 nm to about 50 nm. If the first cap layer 122 is too narrow, the landing space for subsequently formed contact structure may be not enough. The top thickness 122T of the first cap layer 122 above the top surface of the spacer 114 is in a range of about 1 nm to about 30 nm. The bottom thickness 122B of the first cap layer 122 below the top surface of the spacer 114 is in a range of about 1 nm to about 50 nm. If the first cap layer 122 is too thick, the resistance of the subsequently formed contact structure penetrating through the first cap layer 122 may be too great. If the first cap layer 122 is too thin, the isolation between subsequently formed contact structure and conductive elements nearby may not be enough.

Next, the first ILD structure 118 over the source/drain epitaxial structure 116 may be removed, and a trench may be formed over the source/drain epitaxial structure 116 (not shown). The trench may be formed by an etching process such as a dry etching process or a wet etching process.

Next, a metal semiconductor compound layer may be formed over the source/drain epitaxial structure 116 (not shown). The metal semiconductor compound layer may reduce the contact resistance between the source/drain epitaxial structure 116 and the subsequently formed contact structure over the source/drain epitaxial structure 116. The metal semiconductor compound layer may be made of titanium silicide ($TiSi_2$), nickel silicide (NiSi), cobalt silicide (CoSi), or other suitable low-resistance materials. The semiconductor compound layer may be formed over the source/drain epitaxial structure 116 by forming a metal layer over the source/drain epitaxial structure 116 first. The metal layer may react with the source/drain epitaxial structure 116 by an annealing process and the semiconductor compound layer may be produced. Afterwards, the unreacted metal layer may be removed by an etching process and the metal semiconductor compound layer may be left.

Figure 2D:
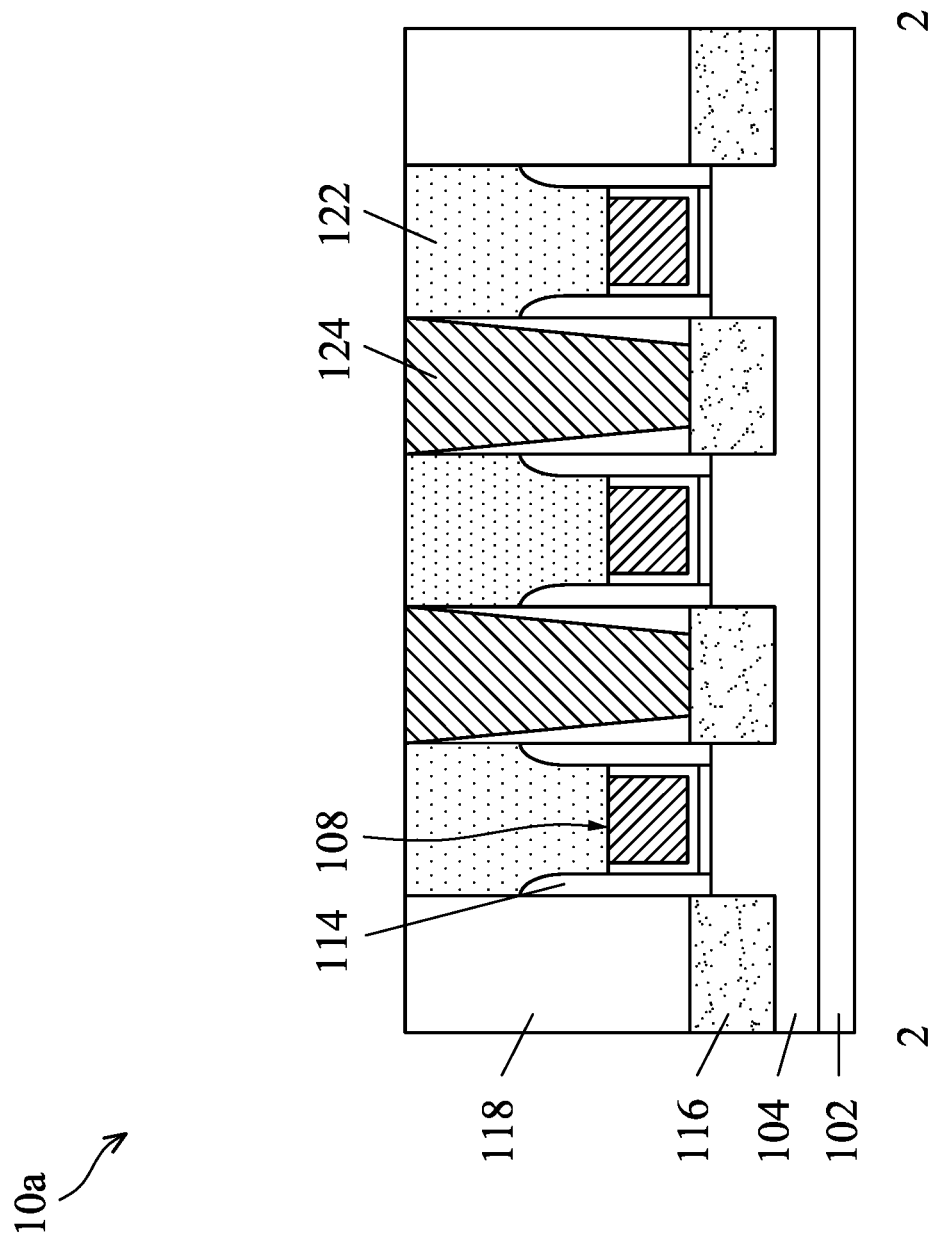

Afterwards, a source/drain contact structure 124 is formed into the trench over the source/drain epitaxial structure 116, as shown in FIG. 2D in accordance with some embodiments. The source/drain contact structure 124 may be made of metal materials (e.g., Co, Ni, W, Ti, Ta, Cu, Al, Ru, Mo, TiN, TaN, and/or a combination thereof), metal alloys, poly-Si, other applicable conductive materials, or a combination thereof. The source/drain contact structure 124 may be formed by a chemical vapor deposition process (CVD), a physical vapor deposition process (PVD), (e.g., evaporation or sputter), an atomic layer deposition process (ALD), an electroplating process, other suitable processes, or a combination thereof to deposit the conductive materials of the source/drain contact structure 124, and then optionally perform a planarization process such as a chemical mechanical polishing (CMP) process or an etch back process to remove excess conductive materials. After the planarization process, the top surface of the source/drain contact structure 124 may be level with the top surface of the first cap layer 122 and the top surface of the first ILD structure 118.

Figure 2E:
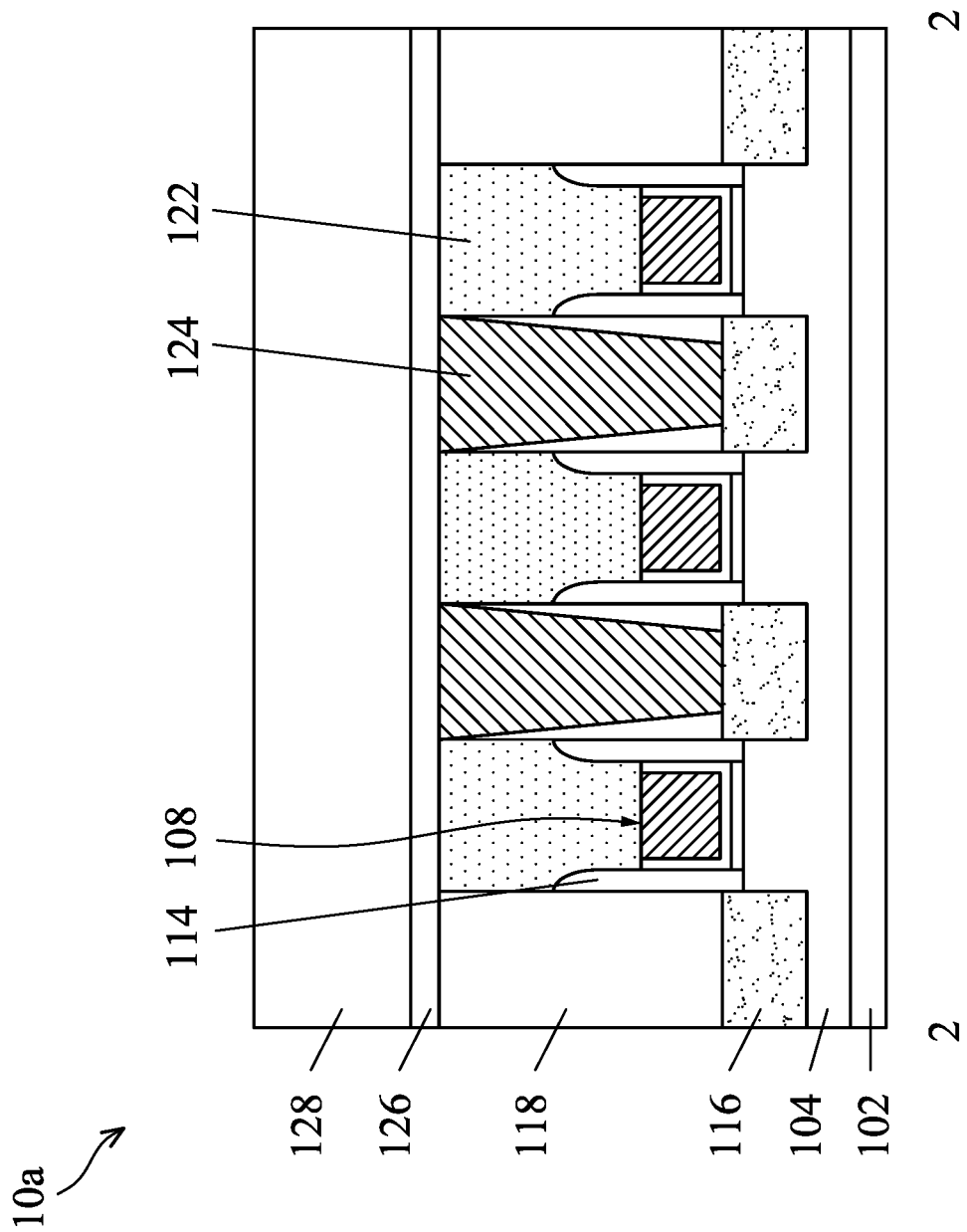

Afterwards, an etch stop layer 126 is formed over the first ILD layer 118 as shown in FIG. 2E in accordance with some embodiments. In some embodiments, the etch stop layer 126 is made of an insulating material such as a dielectric material (e.g., SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO) or undoped silicon. In some embodiments, the etch stop layer 126 is formed using CVD (such as LPCVD, PECVD, HDP-CVD, HARP, and FCVD), ALD, another suitable method, or a combination thereof.

Next, a second ILD structure 128 is formed over the etch stop layer 126, as shown in FIG. 2E in accordance with some embodiments. The second ILD structure 128 may be made of SiO-based material, such as tetraethylorthosilicate (TEOS) oxide, un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the second ILD structure 128 and the first ILD structure 118 are made of the same material. The second ILD structure 128 may be formed using CVD (such as LPCVD, PECVD, HDP-CVD, HARP, and FCVD), ALD, another suitable method, or a combination thereof.

Figure 2F:
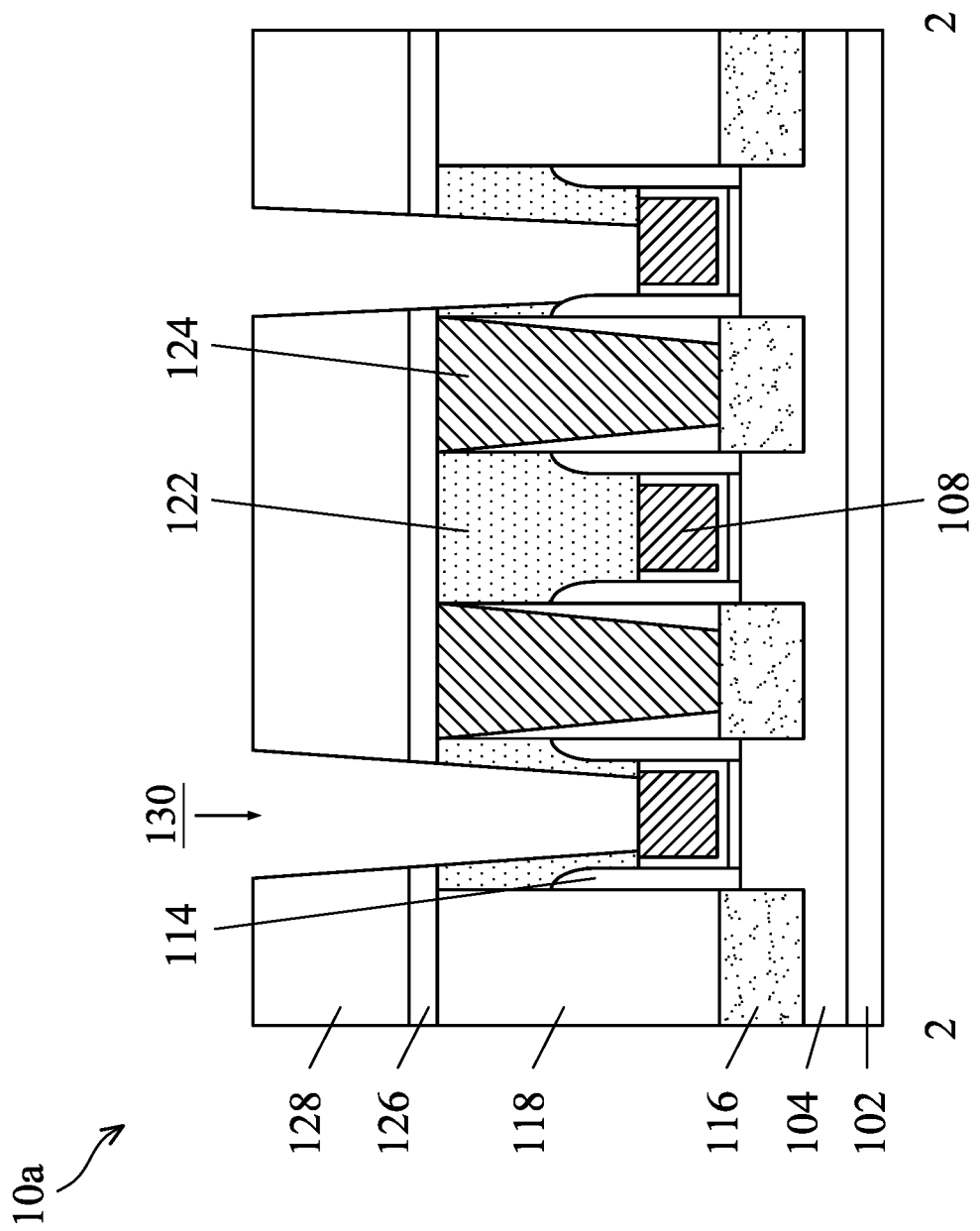

Next, a trench 130 is formed over the gate structure 108, as shown in FIG. 2F in accordance with some embodiments. The trench 130 may be formed by patterning and etching the second ILD structure 128, the etch stop layer 126, and the first cap layer 122. In some embodiments, the gate structure 108 is exposed from the trench 130. The photolithography process may include photoresist coating (e.g. spin-on coating), soft baking, mask aligning, pattern exposure, post-exposure baking, photoresist development, and rinsing and drying (e.g. hard baking), etc. The etching process may include a dry etching process (e.g., reactive ion etching (RIE), anisotropic plasma etching method), a wet etching process, or a combination thereof.

Figure 2G:
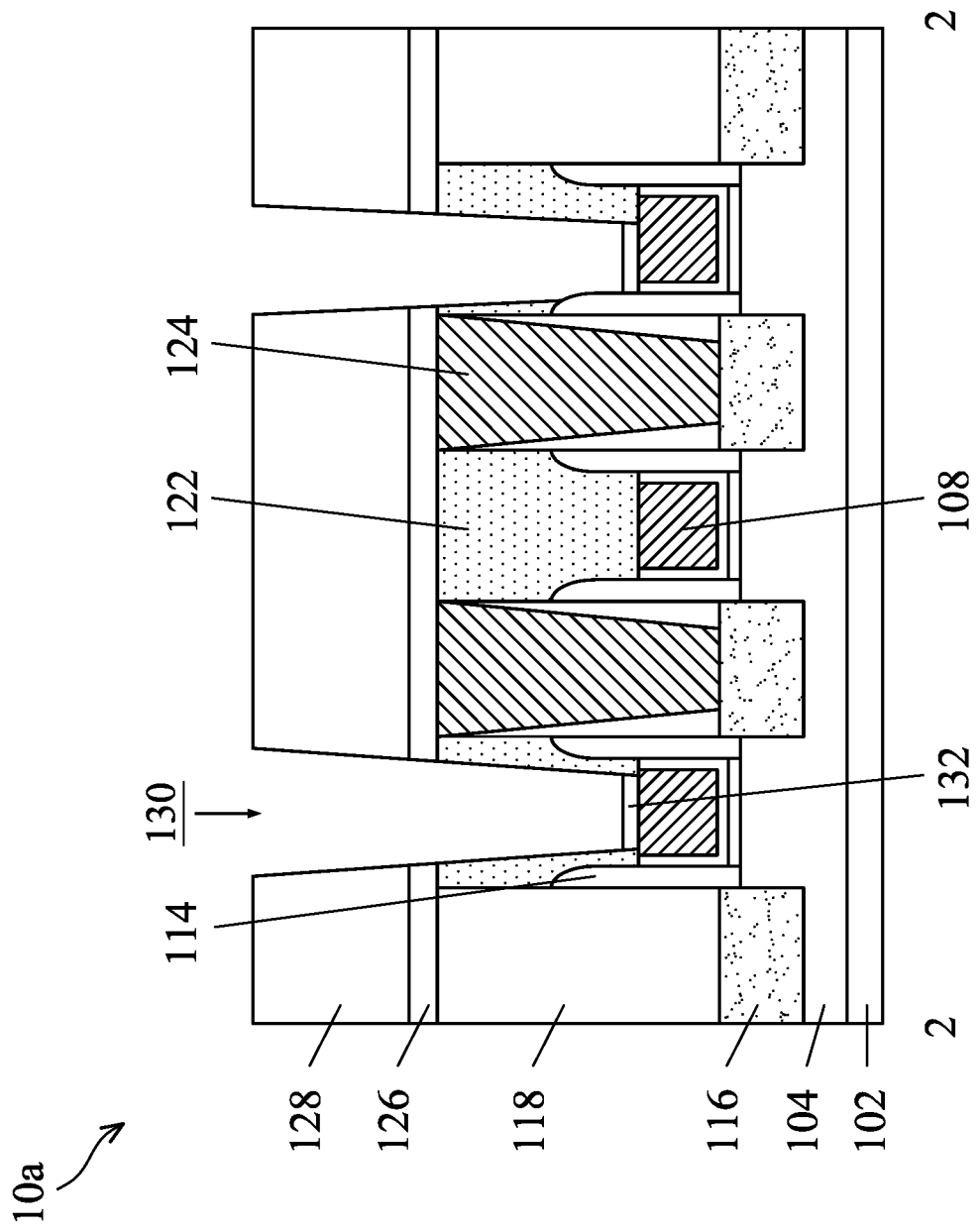

Next, an inhibitor layer 132 is formed in the trench 130 over the top surface of the gate structure 108, as shown in FIG. 2G in accordance with some embodiments. In some embodiments, the inhibitor layer 132 is selectively deposited over the top surface of the gate structure 108, but not on the surfaces of the second ILD structure 128, the etch stop layer 126, and the first cap layer 122. In some embodiments, the inhibitor layer 132 is an organic-like film such as Amphiphilic-like molecules. The inhibitor layer 132 may be deposited over the gate structure 108 by electroless deposition (ELD), PVD, electroplating (ECP), another suitable method, or a combination thereof.

Figure 2H:
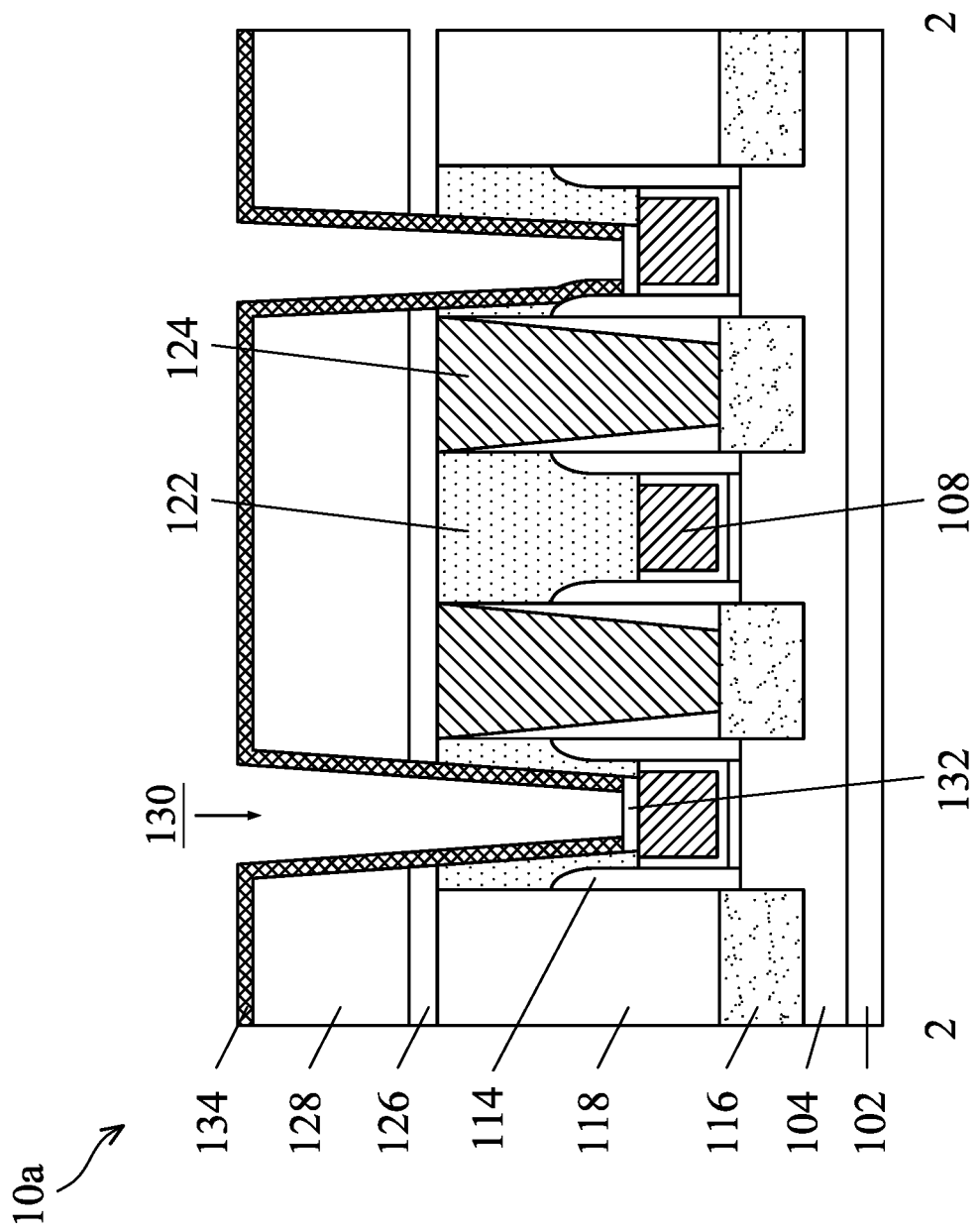

Afterwards, an isolation film 134 is formed over the sidewall of the trench 130, as shown in FIG. 2H in accordance with some embodiments. In some embodiments, the isolation film 134 is selectively deposited over the surfaces of dielectrics such as the surfaces of the second ILD structure 128, the etch stop layer 126, and the first cap layer 122. Therefore, the top surface of the inhibitor layer 132 is exposed from the trench 130 after the isolation film 134 is formed, as shown in FIG. 2H in accordance with some embodiments. In some embodiments, the isolation film 134 is conformally formed over the sidewalls of the trench 130. In some embodiments, the isolation film 134 includes LaO, AlO, Si, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, other suitable materials, or a combination thereof. The isolation film 134 may be deposited by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

Figure 2I:
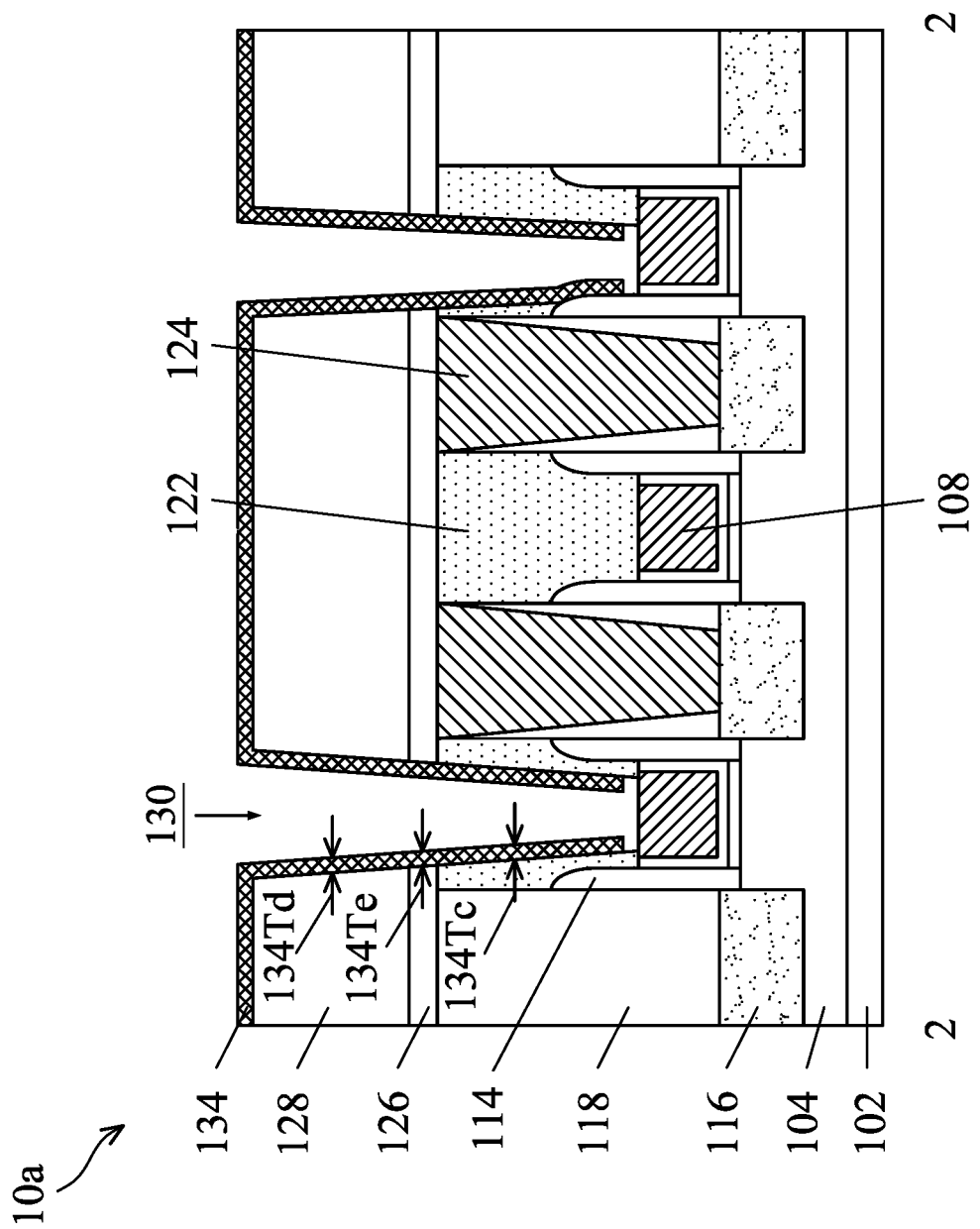

Next, the inhibitor layer 132 is removed, as shown in FIG. 2I in accordance with some embodiments. The inhibitor layer 132 may be removed by a wet etching process such as high-temperature SPM, an ashing process, a plasma dry etching process, a chemical etching process, other applicable processes, or a combination thereof. As shown in FIG. 2I, after the inhibitor layer 132 is removed, the isolation film 134 is separated from the gate structure 108. In some embodiments, the bottom surface of the isolation film 134 is between the top surface of the gate structure 108 and the top surface of the first cap layer 122. In some embodiments, the bottom surface of the isolation film 134 is below the top surface of the first cap layer 122 and higher than the top surface of the gate structure 108.

In some embodiments as shown in FIG. 2I, the thickness 134Td of the isolation film 134 beside the second ILD structure 128 is in a range from about 0.5 nm to about 10 nm. In some embodiments as shown in FIG. 2I, the thickness 134Te of the isolation film 134 beside the etch stop layer 126 is in a range from about 0.5 nm to about 10 nm. In some embodiments as shown in FIG. 2I, the thickness 134Tc of the isolation film 134 beside the first cap layer 122 is in a range from about 0.5 nm to about 10 nm. If the thickness 134Td/134Te/134Tc of the isolation film 134 is too thick, the resistance of subsequently formed contact structure may increase. If the thickness 134Td/134Te/134Tc of the isolation film 134 is too thin, there may be leakage current between subsequently formed contact structure and its nearby conductive elements.

In some embodiments, the thickness 134Td of the isolation film 134 beside the second ILD structure 128, the thickness 134Te of the isolation film 134 beside the etch stop layer 126, and the thickness 134Tc of the isolation film 134 beside the first cap layer 122 are substantially the same. If the difference of the thicknesses 134Td/134Te/134Tc of the isolation film 134 is too great, the resistance of the subsequently formed contact structure may be not uniform.

Figures 1, 2J:
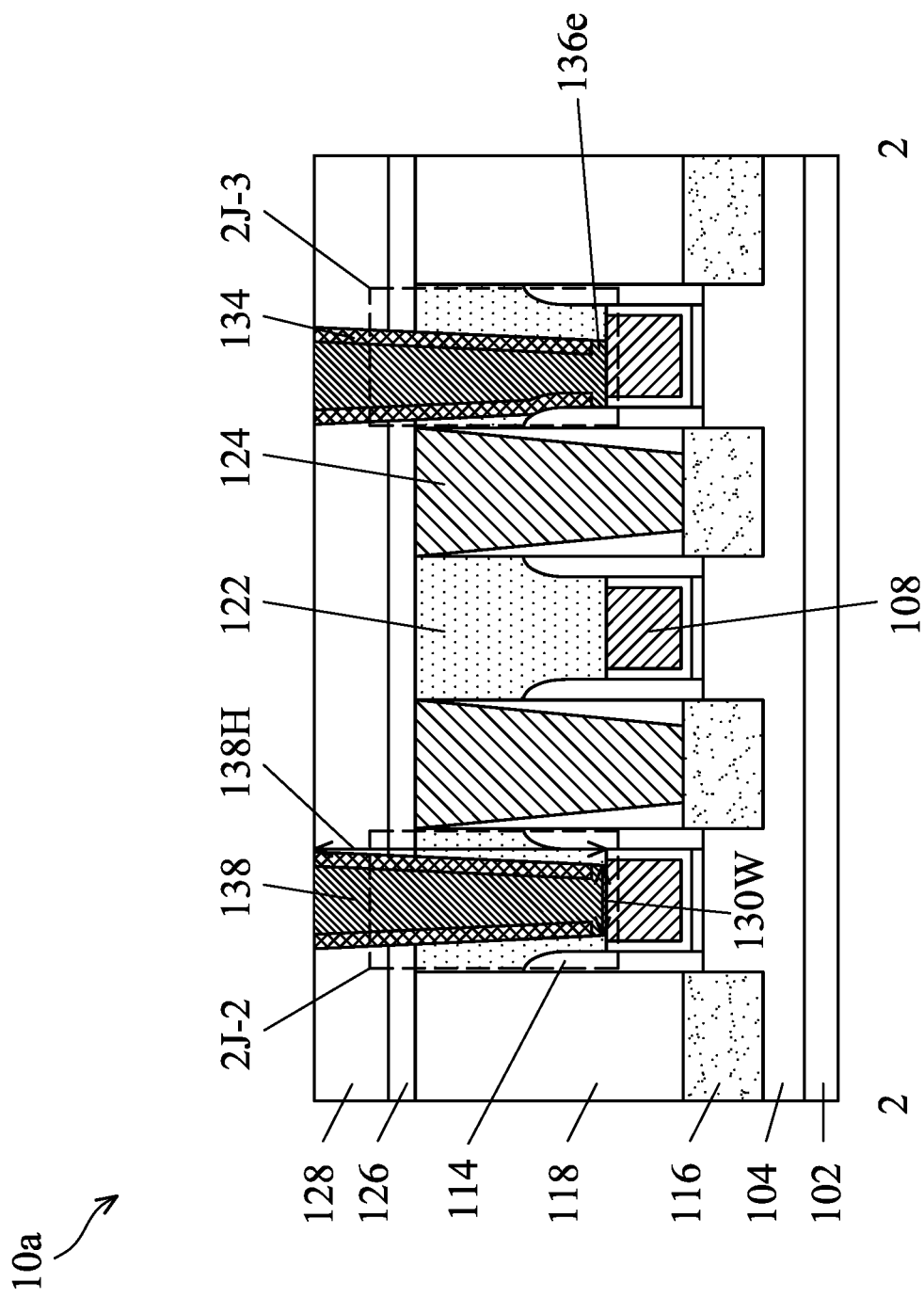
Figures 2, 2J:
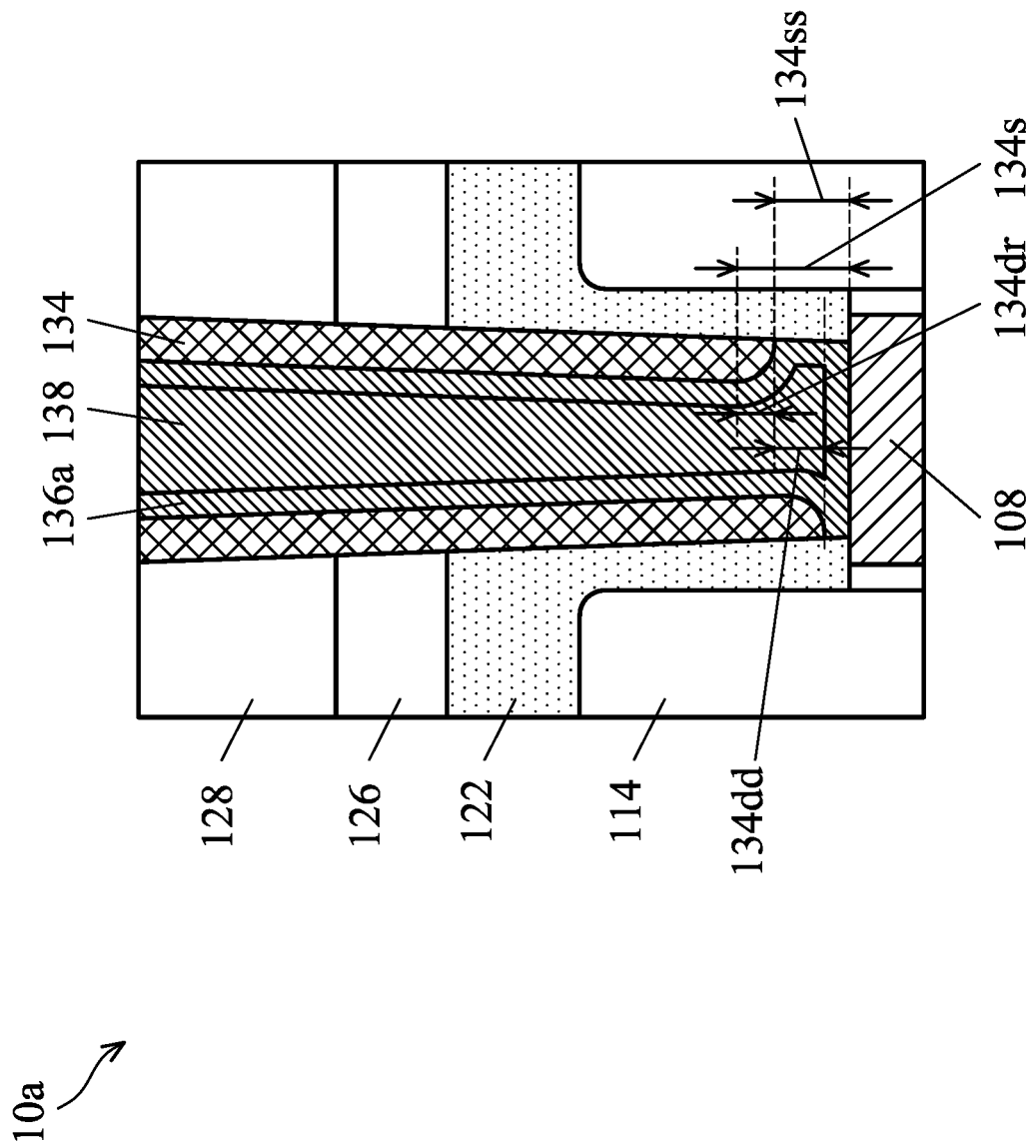
Figures 2, 2J, 3:
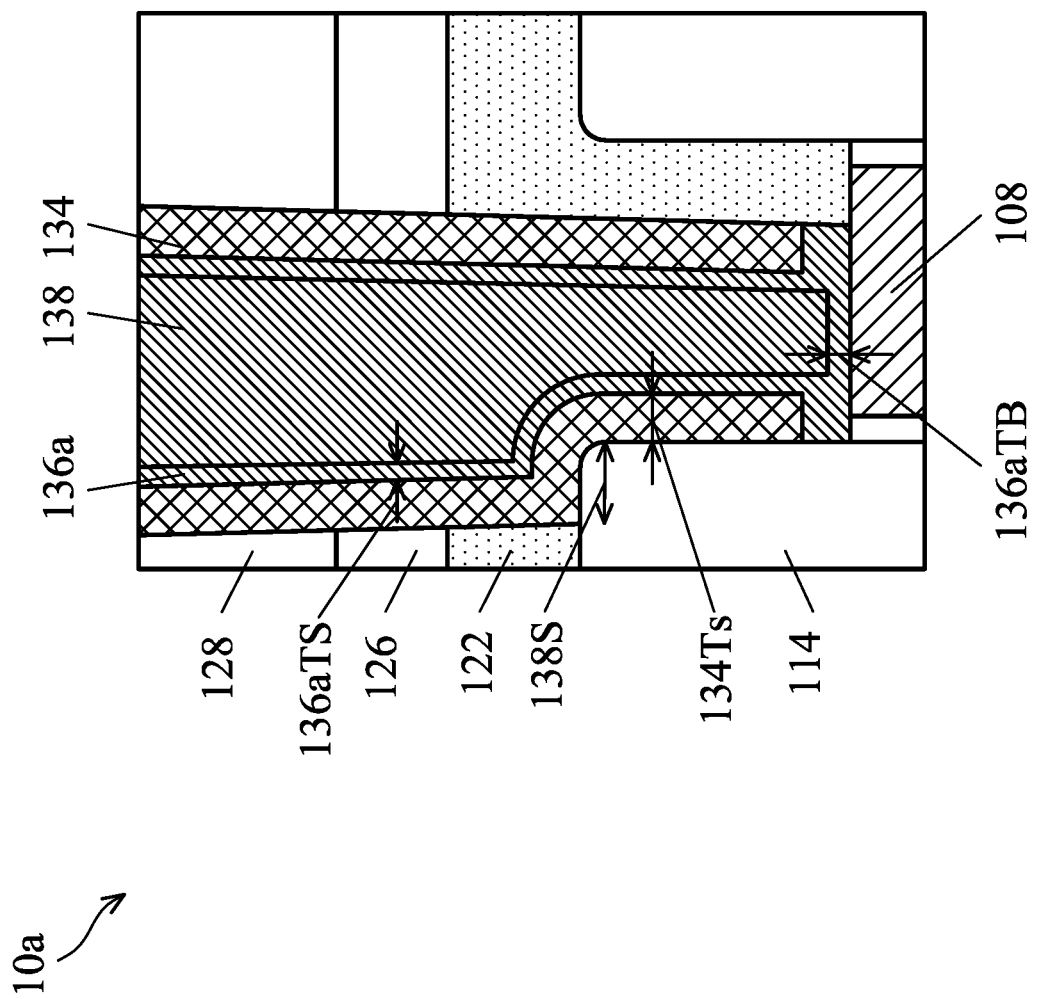

FIGS. 2J-2 and 2J-3 show enlarged view of FinFET device structure 10a taken in dashed boxes 2J-2 and 2J-3 in FIG. 2J-1. In some embodiments as shown in FIG. 2J-2, the depth difference 134dd of adjacent isolation films 134 is in a range from about 0.5 nm to about 10 nm. In some embodiments, there is no depth difference between adjacent isolation films 134. In some embodiments as shown in FIG. 2J-2, the isolation film 134 has a rounding bottom profile. For example, the depth difference 134dr of opposite sides of the same isolation film 134 is in a range from about 0.5 nm to about 10 nm. In some embodiments, the depths of opposite sides of the same isolation film 134 are substantially the same. If the depth difference 134dd of adjacent isolation films 134 and the depth difference 134dr of opposite sides of the same isolation film 134 are too great, the resistance of the subsequently formed contact structure may be not uniform.

In some embodiments as shown in FIG. 2J-2, the spacing 134s between the isolation films 134 and the gate structure 108 away from the sidewall of the trench 130 is in a range from about 0.5 nm to about 10 nm. In some embodiments as shown in FIG. 2J-2, the spacing 134ss between the isolation films 134 and the gate structure 108 near the sidewall of the trench 130 (near the dielectric of the first cap layer 122) is in a range from about 0.5 nm to about 10 nm. The spacing 134s/134ss between the isolation films 134 and the gate structure 108 may depend on the thickness of the inhibitor layer 132. In some embodiments, the spacing 134s between the isolation films 134 and the gate structure 108 away from the sidewall of the trench 130 and the spacing 134ss between the isolation films 134 and the gate structure 108 near the sidewall of the trench 130 are substantially the same.

In some embodiments as shown in FIG. 2J-3, the trench 130 is in contact with the spacers 114. Therefore, the subsequently contact structure formed in the trench 130 may be in contact with the spacers 114 and the distance between the subsequently contact structure and its nearby conductive elements may be shorter. The isolation films 134 may provide isolation between the subsequently contact structure and its nearby conductive elements.

In some embodiments as shown in FIG. 2J-3, the thickness 134Ts of the isolation film 134 beside the spacer 114 is in a range from about 0.5 nm to about 10 nm. If the thickness 134Ts of the isolation film 134 is too thick, the resistance of subsequently formed contact structure may increase. If the thickness 134Ts of the isolation film 134 is too thin, there may be leakage current between subsequently formed contact structure and its nearby conductive elements.

Next, a first barrier layer 136a is optionally conformally formed over the bottom surface and the sidewalls of the trench 130, as shown in FIGS. 2J-2 and 2J-3 in accordance with some embodiments. As shown in FIGS. 2J-2 and 2J-3, the first barrier layer 136a fills the space between the bottom surface of the isolation film 134 and the top surface of the gate structure 108. The first barrier layer 136a may be formed before filling the conductive material in the trench 130 to prevent the conductive material from diffusing out. The first barrier layer 136a may also serve as an adhesive layer or a glue layer. The material of the first barrier layer 136a may be Co, W, Ru, Al, Mo, Ti, TiN, TiSi, CoSi, NiSi, Cu, TaN, other applicable materials, or a combination thereof. The first barrier layer 136a may be formed by depositing the barrier layer materials by a physical vapor deposition process (PVD) (e.g., evaporation or sputtering), an atomic layer deposition process (ALD), an electroplating process, other applicable processes, or a combination thereof.

In some embodiments, the bottom thickness 136aTB of the first barrier layer 136a is in a range from about 0.1 nm to about 4 nm. In some embodiments, the sidewall thickness 136aTS of the first barrier layer 136a is in a range from about 0.1 nm to about 4 nm. If the thickness 136aTB/136aTS of the first barrier layer 136a is too thick, the resistance may increase, and will be harder for metal 138 to gap fill. If the thickness of the first barrier layer 136a is too thin, the subsequently filled conductive material of the contact structure may diffuse out.

Afterwards, a contact structure 138 is formed in the trench 130 over the gate structure 108, as shown in FIGS. 2J-1, 2J-2, and 2J-3. In some embodiments, the contact structure 138 penetrates through the first cap layer 122. In some embodiments, the isolation film 134 formed over the sidewalls of the contact structure 138 but leaves a space between the isolation film 134 and the gate structure 108. Therefore, contact structure 138 has an extending portion 136e beneath the bottom surface of the isolation film 134.

The contact structure 138 may be made of conductive materials such as Co, W, Ru, Al, Mo, Ti, TiN, TiSi, CoSi, NiSi, Cu, TaN, other applicable conductive materials, or a combination thereof. The contact structure 138 may be formed by a bottom-up deposition process, a chemical vapor deposition process (CVD), a physical vapor deposition process (PVD, e.g., evaporation or sputter), an atomic layer deposition process (ALD), an electroplating process, other suitable processes, or a combination thereof to deposit the conductive materials of the contact structure 138, and then optionally perform a chemical mechanical polishing (CMP) process or an etch back process to remove excess conductive materials.

In some embodiments as shown in FIG. 2J-1, the bottom width 138W of the contact structure 138 is in a range from about 2 nm to about 30 nm. If the bottom width 138W of the contact structure 138 is too narrow, the interface resistance may increase. If the bottom width 138W of the contact structure 138 is too wide, the contact structure 138 may be too close to its nearby conductive elements and there may be leakage current between the contact structure 138 and its nearby conductive elements.

In some embodiments as shown in FIG. 2J-1, the height 138H of the contact structure 138 is in a range from about 3 nm to about 50 nm. If the contact structure 138 is too tall, the contact resistance may increase. If the contact structure 138 is too short, meaning that metal gate 108 and BEOL metal (MO) becomes closer. Then, the TDDB between them will degrade drastically.

In some embodiments as shown in FIG. 2J-3, the overlay shift 138S of the contact structure 138 toward the spacer 114 is in a range from about 0.1 nm to about 10 nm. If the overlay shift 138S of the contact structure 138 is too much, the contact structure 138 may be too close to its nearby conductive elements and there may be leakage current between the contact structure 138 and its nearby conductive elements. In some embodiments, the contact structure 138 substantially keeps the same distance between the contact structure 138 and the spacers 114 on the opposite sides.

Figures 1, 2K:
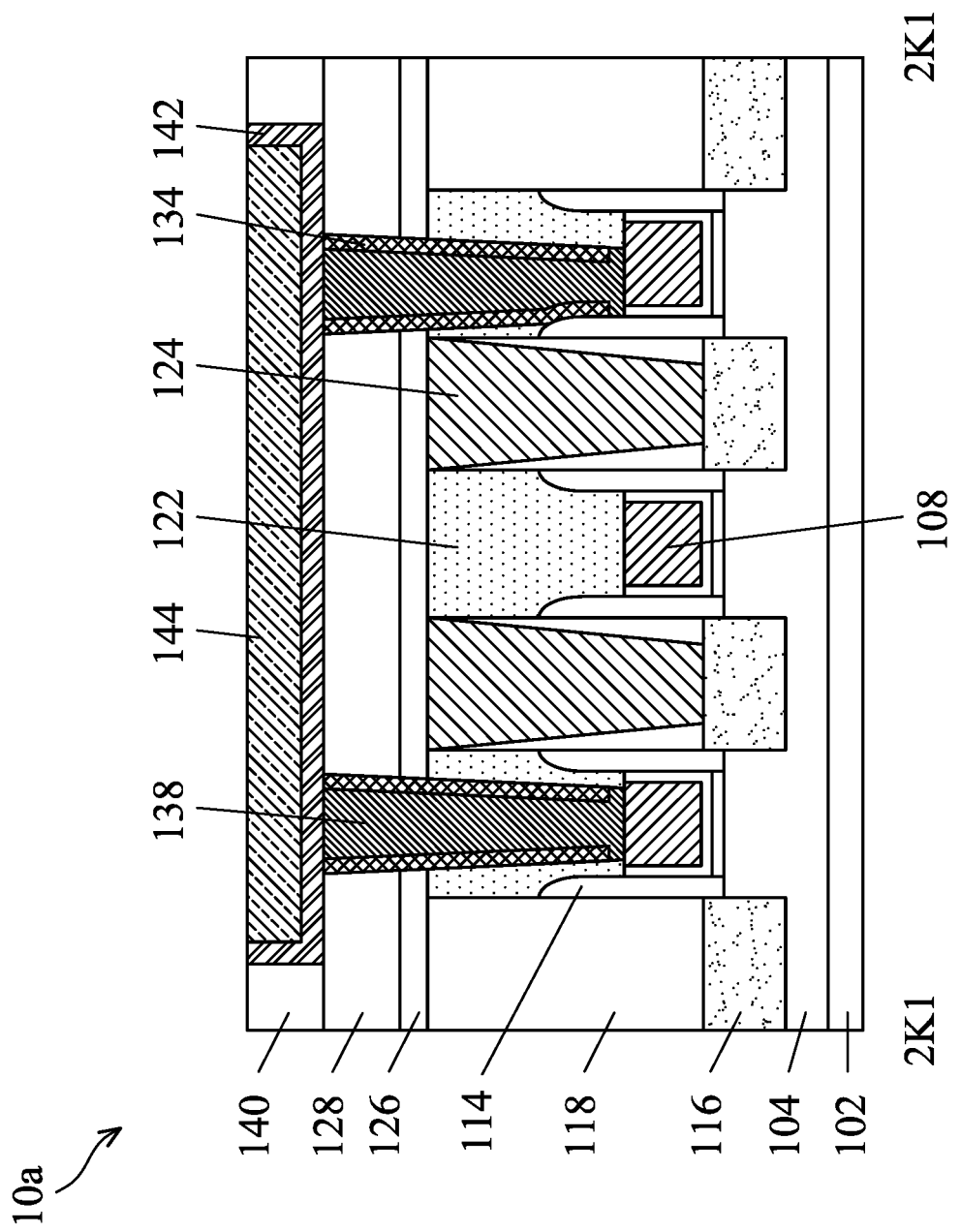
Figures 2, 2K:
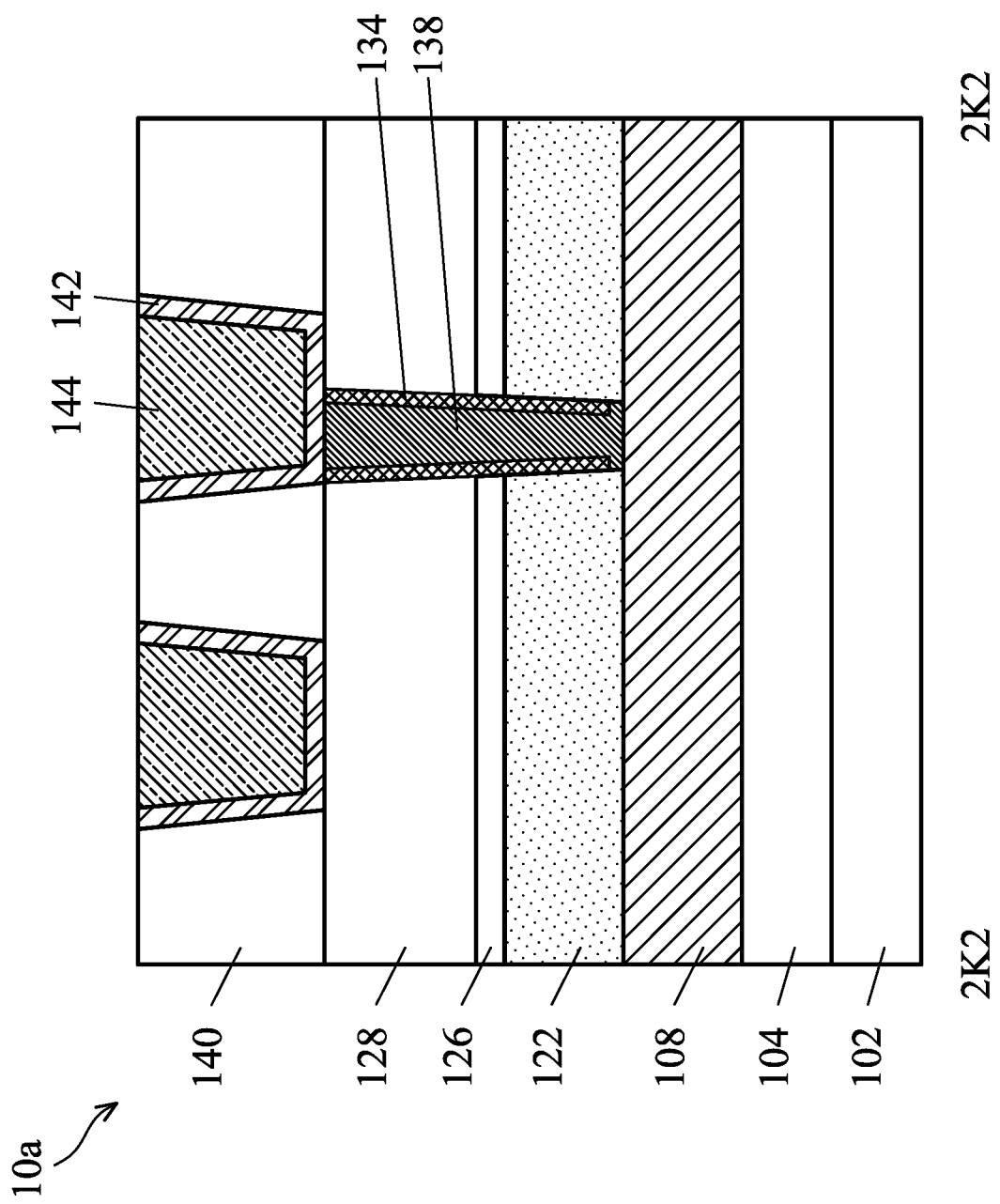
Figures 2, 2K, 3:
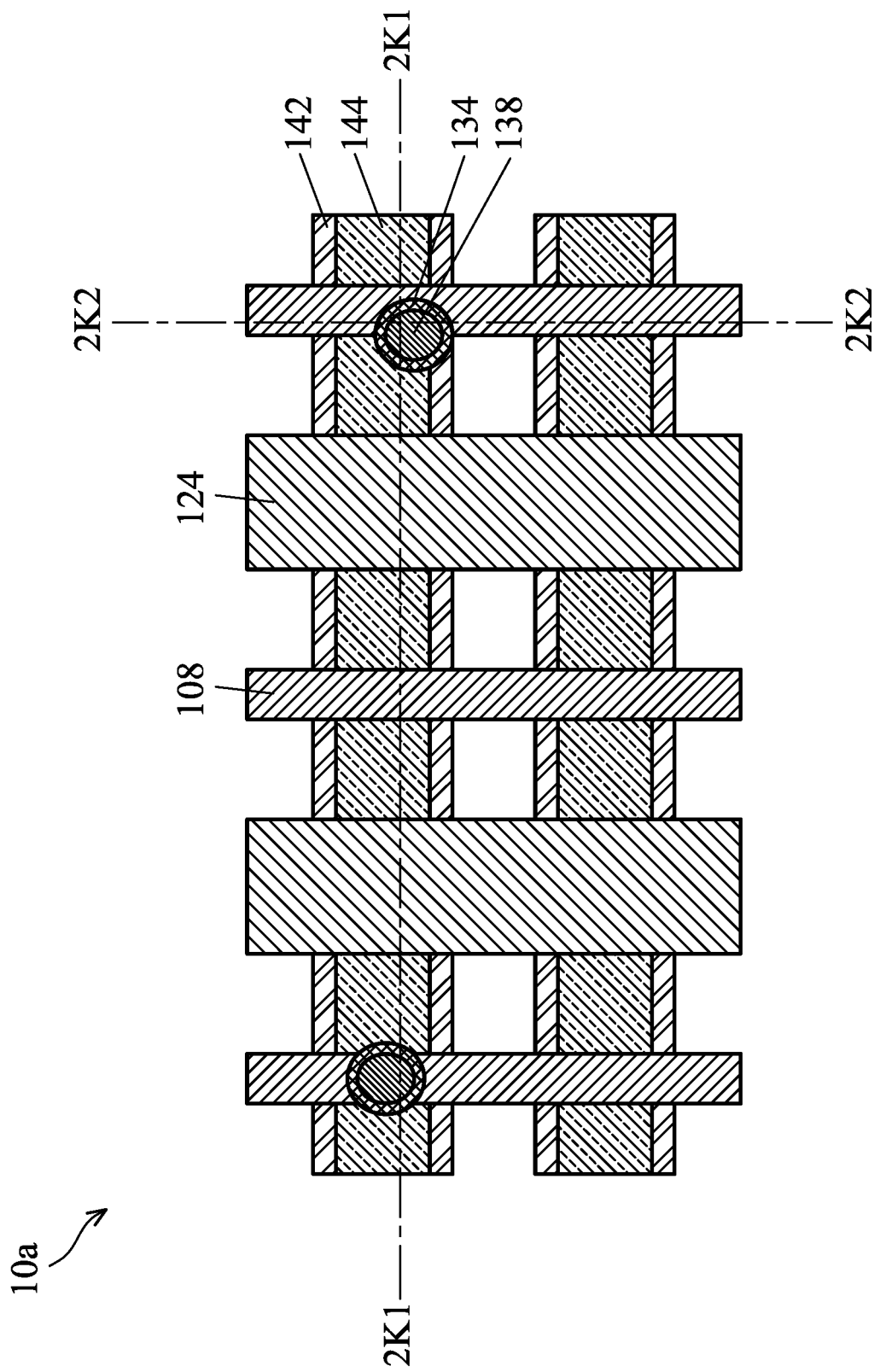

FIG. 2K-3 is a top view of a FinFET device structure 10a, in accordance with some embodiments of the disclosure. FIG. 2K-1 shows cross-sectional representations taken along line 2K1-2K1 in FIG. 2K-3 in accordance with some embodiments. FIG. 2K-2 shows cross-sectional representations taken along line 2K2-2K2 in FIG. 2K-3 in accordance with some embodiments.

After the contact structure 138 is formed, a hard mask layer 140 is blanketly deposited over the contact structure 138 and the second ILD structure 128 as shown in FIGS. 2K-1 and 2K-2 in accordance with some embodiments. The hard mask layer 140 may be made of silicon oxide, silicon nitride, silicon oxynitride, other applicable materials, or a combination thereof. The hard mask layer 140 may be formed by deposition processes such as a chemical vapor deposition (CVD) process, a high-density plasma chemical vapor deposition (HDPCVD) process, a spin-on process, a sputtering process, other applicable process, or a combination thereof.

Afterwards, a patterning and an etching process are performed to form an opening in the hard mask layer 140 by using a patterned photoresist layer as a mask (not shown). The patterning process may include a photolithography process and an etching process. Examples of photolithography processes may include photoresist coating, soft baking, mask aligning, exposure, post-exposure baking, developing the photoresist, rinsing and drying. The etching process may be a dry etching process or a wet etching process. In some embodiments, the contact structure 138 is exposed from the opening in the hard mask layer 140.

Next, a glue layer 142 is optionally conformally formed over the bottom surface and the sidewalls of the opening in the hard mask layer 140 as shown in FIGS. 2K-1 and 2K-2 in accordance with some embodiments. The material of the glue layer 142 may be TiN, TaN, TiO, TaO, TiSiN, other applicable materials, or a combination thereof. The glue layer 142 may be formed by depositing the glue layer materials by a physical vapor deposition process (PVD) (e.g., evaporation or sputtering), an atomic layer deposition process (ALD), an electroplating process, other applicable processes, or a combination thereof.

After depositing the glue layer 142, the opening is filled by a conductive material and a metal layer 144 is formed in the opening as shown in FIGS. 2K-1 and 2K-2 in accordance with some embodiments. The material of the metal layer 144 may be W, Ru, Co, Cu, other applicable materials, or a combination thereof. The metal layer 144 may be formed by depositing the metal layer material by a physical vapor deposition process (PVD) (e.g., evaporation or sputtering), an atomic layer deposition process (ALD), an electroplating process, other applicable processes, or a combination thereof. After the metal layer material is deposited, a planarization process (e.g., a chemical mechanical polishing process or an etching back process) may optionally be performed to remove excess metal layer materials. Therefore, the top surface of the metal layer 144 may be exposed. In addition, the top surface of the metal layer 144 is level with the top surfaces of the glue layer 142 and the hard mask layer 140 as shown in FIGS. 2K-1 and 2K-2 in accordance with some embodiments.

As shown in FIGS. 2K-1, 2K-2, and 2K-3, the contact structure 138 may not be aligned with the center of the beneath gate structure 108 or the above metal layer 144, which may increase leakage current between the contact structure 138 and its nearby conductive elements (such as source/drain contact structure 124 or adjacent metal layer 144).

Forming the isolation film 134 over the sidewalls of the contact structure 138 may reduce leakage current and reliability failure such as time-dependent dielectric breakdown (TDDB) between the contact structure 138 and its nearby conductive elements. In addition, the isolation film 134 is not formed over the top surface of the gate structure 108. Therefore, the contact structure 138 extends beneath the bottom surface of the isolation film 134 and the interface resistance may be maintained.

Many variations and/or modifications may be made to the embodiments of the disclosure. FIGS. 3A-3C, 3D-1, 3D-2, 3E-1, and 3E-2 are cross-sectional representations of various stages of forming a FinFET device structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 3E-1 in accordance with some embodiments, the contact structure 138 includes a bottom portion 138B and a top portion 138T, and the isolation film 134 is formed over the sidewalls of the top portion 138T of the contact structure 138.

Figure 3A:
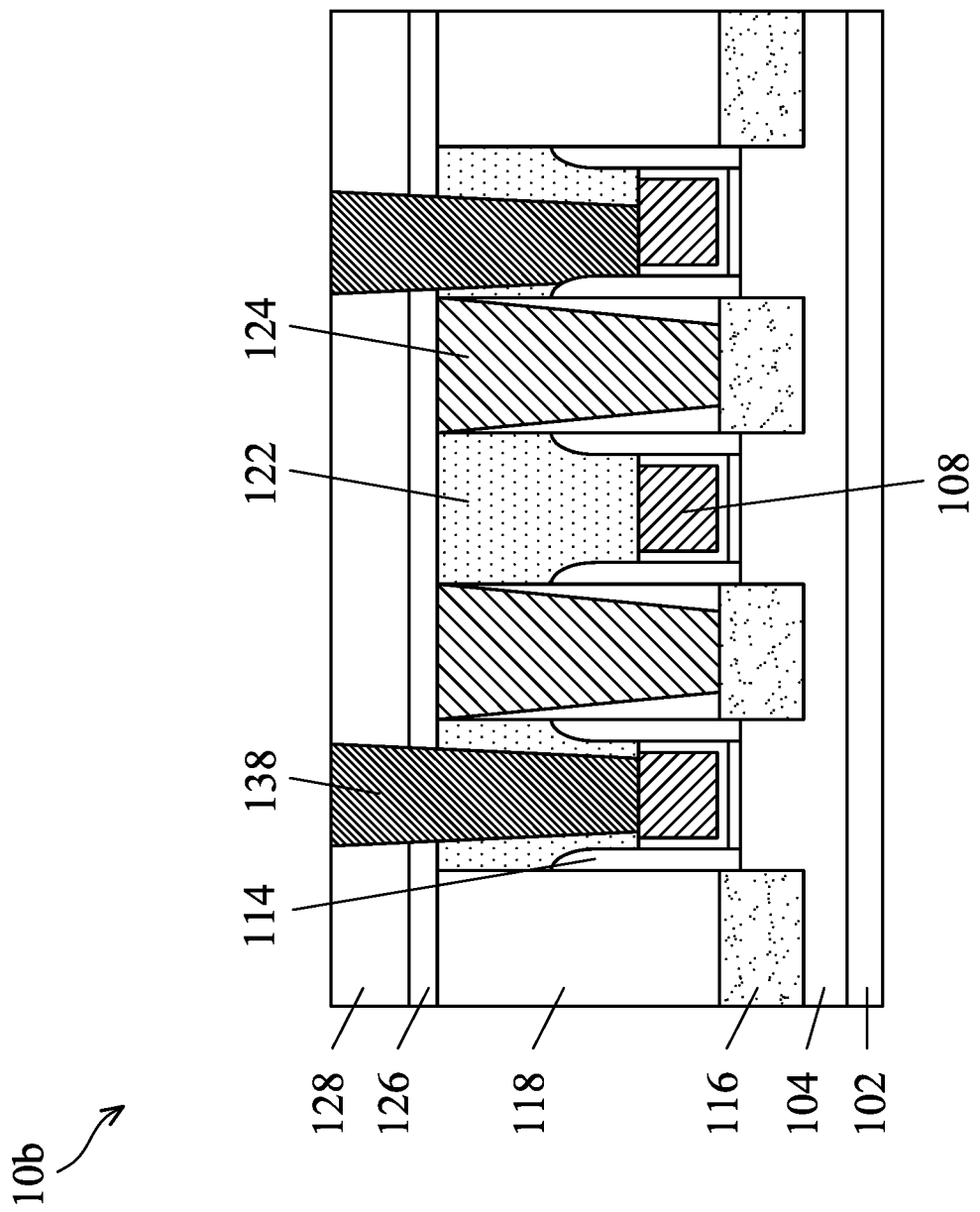
Figure 3B:
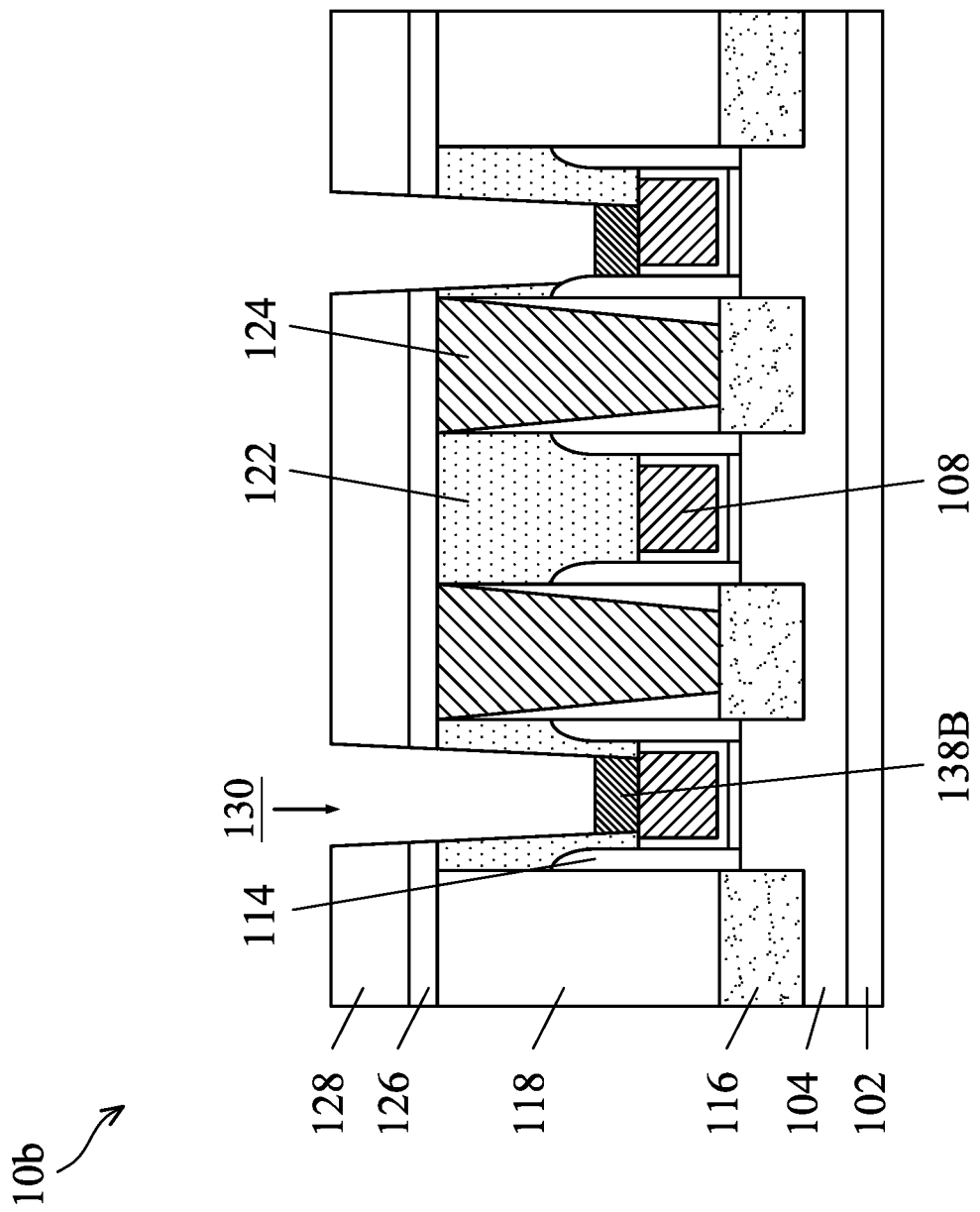
Figure 3C:
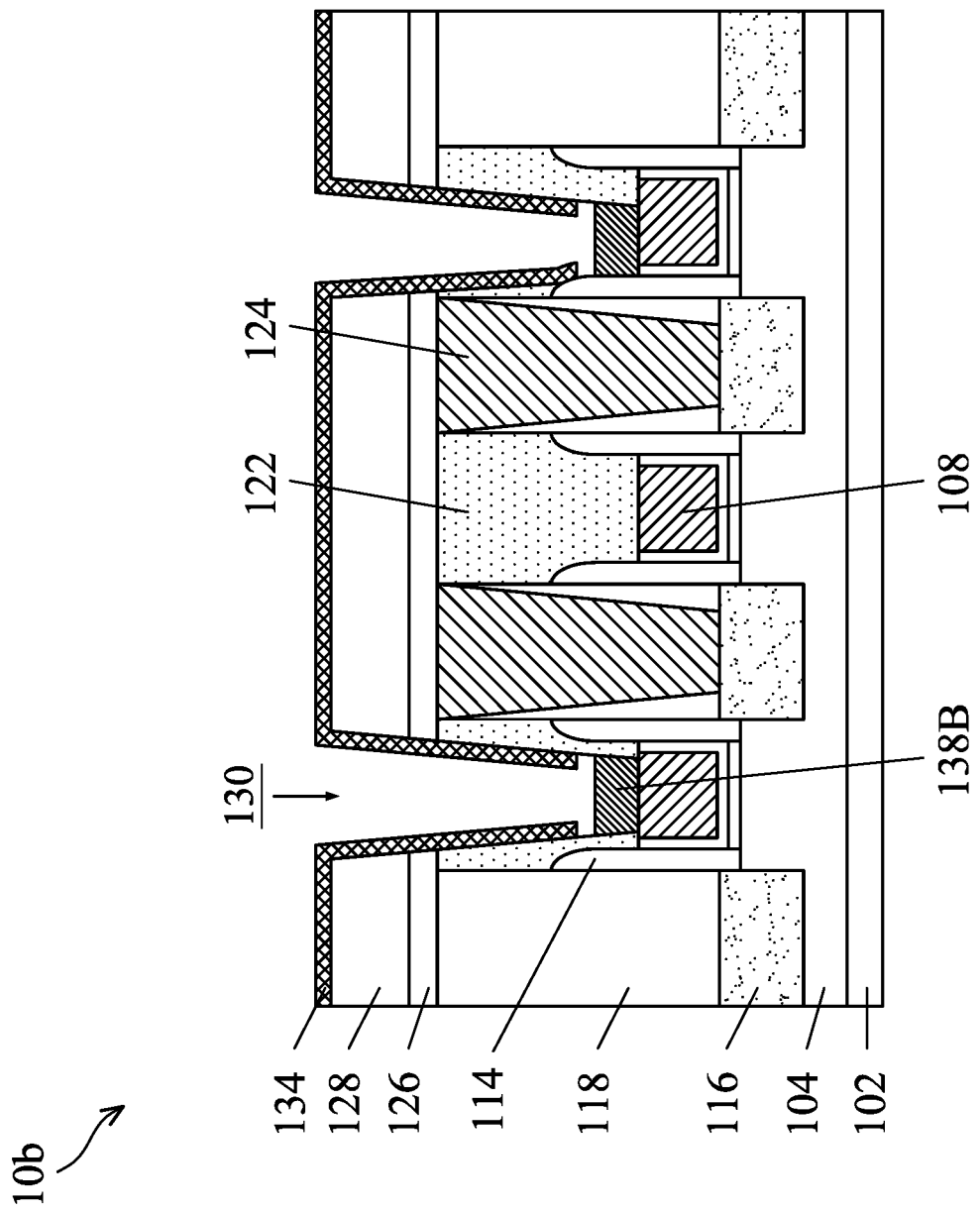
Figures 1, 3D:
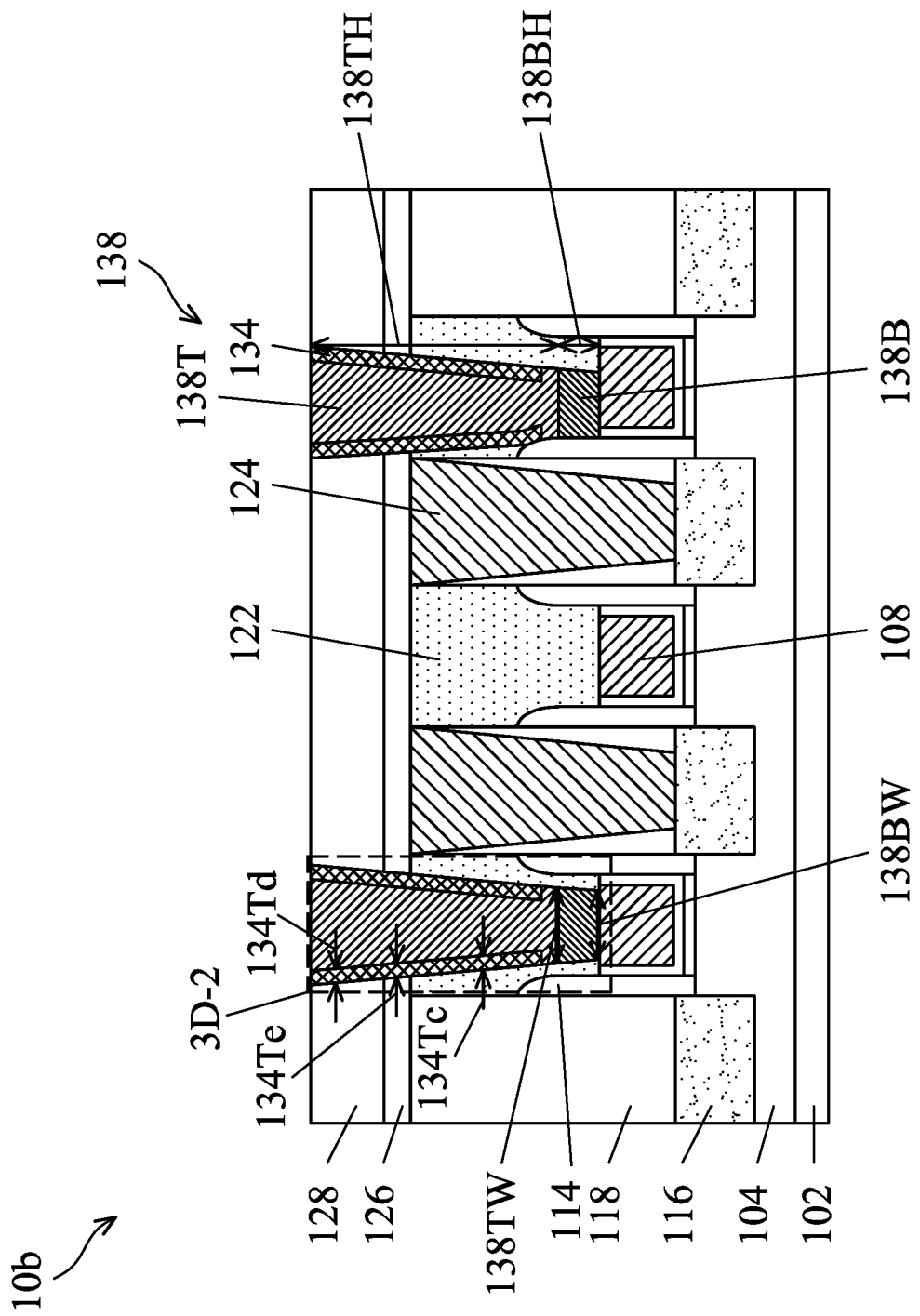
Figures 2, 3D:
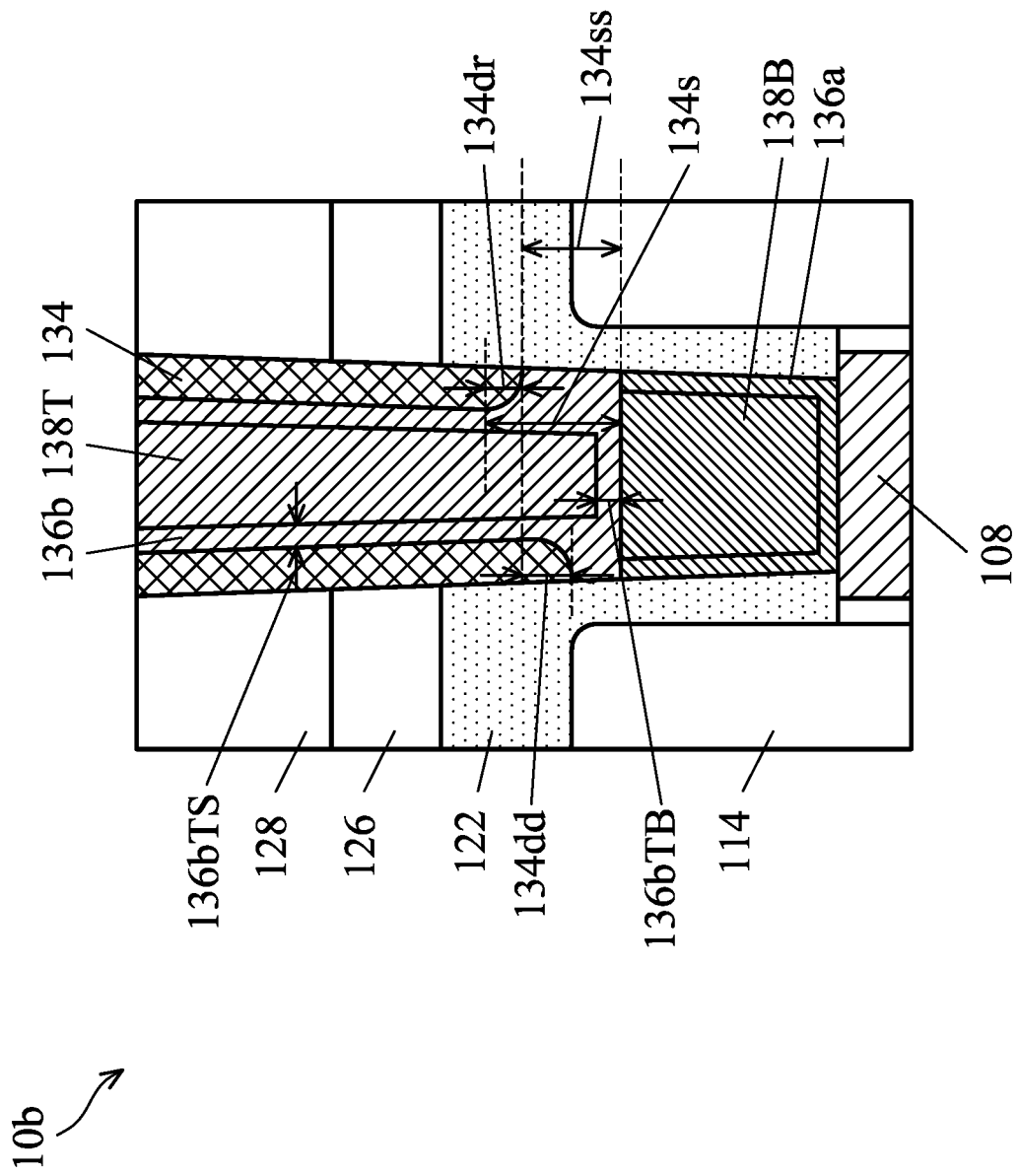

In some embodiments, a first barrier layer 136a is optionally conformally formed over the bottom surface and the sidewalls of the trench 130, as shown in FIG. 3D-2 in accordance with some embodiments. Afterwards, the first conductive material of the contact structure 138 are filled in the trench 130. After the conductive material of the contact structure 138 is deposited, a planarization process such as a chemical mechanical polishing process may optionally be performed to remove excess conductive material. The material of the first barrier layer 136a may be Co, W, Ru, Al, Mo, Ti, TiN, TiSi, CoSi, NiSi, Cu, TaN, other applicable materials, or a combination thereof. The first conductive material may be Co, W, Ru, Al, Mo, Ti, TiN, TiSi, CoSi, NiSi, Cu, TaN, other applicable materials, or a combination thereof. The processes for forming the first barrier layer 136a and the contact structure 138 may be the same as, or similar to, those used to form the first barrier layer 136a and the contact structure 138 in the embodiment shown in FIGS. 2J-1, 2J-2, and 2J-3. For the purpose of brevity, the descriptions of these processes are not repeated herein.

In some embodiments, the bottom thickness of the first barrier layer 136a is in a range from about 0.1 nm to about 4 nm. In some embodiments, the sidewall thickness of the first barrier layer 136a is in a range from about 0.1 nm to about 4 nm.

Next, the contact structure 138 is etched back and a trench 130 is formed over the remaining bottom portion 138B of the contact structure 138, as shown in FIG. 3B in accordance with some embodiments. The contact structure 138 may be etched back by one or more etching processes, such as dry etching process and/or wet etching process. In some embodiments, the top surface of the bottom portion 138B of the contact structure 138 is below the top surface of the first cap layer 122.

Afterwards, an inhibitor layer is selectively formed over the top surface of the bottom portion 138B of the contact structure 138 exposed from the trench 130 (not shown). An isolation film 134 is then selectively formed over the sidewalls of the trench 130, including over the surfaces of the second ILD structure 128, the etch stop layer 126, the first cap layer 122, and the spacer 114. However, the isolation film 134 may not be formed over the inhibitor layer and therefore the top surface of the inhibitor layer is exposed from the trench 130 after depositing the isolation film 134.

In some embodiments, the isolation film 134 includes LaO, AlO, Si, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, other applicable materials, or a combination thereof. The processes for forming the isolation film 134 may be the same as, or similar to, those used to form the isolation film 134 in the embodiment shown in FIGS. 2G-2I. For the purpose of brevity, the descriptions of these processes are not repeated herein.

Next, the inhibitor is removed as shown in FIG. 3C in accordance with some embodiments, leaving a space between the isolation film 134 and the bottom portion 138B of the contact structure 138. Therefore, the isolation film 134 may be separated from the bottom portion 138B of the contact structure 138. The bottom surface of the isolation film 134 is higher than the top surface of the bottom portion 138B of the contact structure 138. The processes and the materials for forming and removing the inhibitor layer may be the same as, or similar to, those used to form the inhibitor layer 132 in the embodiment shown in FIGS. 2G-2I. For the purpose of brevity, the descriptions of these processes and materials are not repeated herein.

Next, a second barrier layer 136b is optionally conformally formed over the bottom surface and the sidewalls of the trench 130, as shown in FIG. 3D-2 in accordance with some embodiments. In some embodiments, the second barrier layer 136b is formed over the top surface of the bottom portion 138B of the contact structure 138. Afterwards, a second conductive material is filled in the trench 130 and a top portion 138T of the contact structure 138 is formed. Therefore, the second barrier layer 136b formed over the sidewalls of the top portion 138T of the contact structure 138.

After the second conductive material is deposited, a planarization process such as a chemical mechanical polishing process may optionally be performed to remove excess second conductive material. The processes for forming the second barrier layer 136b may be the same as, or similar to, those used to form the first barrier layer 136a. For the purpose of brevity, the descriptions of these processes are not repeated herein.

The top portion 138T of the contact structure 138 may be formed by a bottom-up deposition process, a chemical vapor deposition process (CVD), a physical vapor deposition process (PVD, e.g., evaporation or sputter), an atomic layer deposition process (ALD), an electroplating process, other suitable processes, or a combination thereof to deposit the second conductive material of the top portion 138T of the contact structure 138. In some embodiments, the processes for depositing the bottom portion 138B of the contact structure 138 and the top portion 138T of the contact structure 138 are different. For example, the bottom portion 138B of the contact structure 138 may be formed by bottom-up deposition process, and the top portion 138T of the contact structure 138 may be formed by physical vapor deposition process. Therefore, the quality of the contact structure 138 and the deposition rate may be maintained.

The material of the second barrier layer 136b may be Co, W, Ru, Al, Mo, Ti, TiN, TiSi, CoSi, NiSi, Cu, TaN, other applicable materials, or a combination thereof. In some embodiments, the second barrier layer 136b and the first barrier layer 136a are made of the same material.

The second conductive material may be Co, W, Ru, Al, Mo, Ti, TiN, TiSi, CoSi, NiSi, Cu, TaN, other applicable materials, or a combination thereof. The second conductive material may be selected to avoid metal diffusion to subsequently formed metal layer over the top portion 138T of the contact structure 138. In some embodiments, the bottom portion 138B of the contact structure 138 and the top portion 138T of the contact structure 138 are made of different materials.

In some embodiments as shown in FIG. 3D-1, the thickness 134Td of the isolation film 134 beside the second ILD structure 128 is in a range from about 0.5 nm to about 10 nm. In some embodiments as shown in FIG. 3D-1, the thickness 134Te of the isolation film 134 beside the etch stop layer 126 is in a range from about 0.5 nm to about 10 nm. In some embodiments as shown in FIG. 3D-1, the thickness 134Tc of the isolation film 134 beside the first cap layer 122 is in a range from about 0.5 nm to about 10 nm. In some embodiments, the thicknesses 134Td/134Te/134Tc of the isolation film 134 are substantially the same.

FIG. 3D-2 shows an enlarged view of FinFET device structure 10b taken in dashed box 3D-2 in FIG. 3D-1. In some embodiments as shown in FIG. 3D-2, the depth difference 134dd of adjacent isolation films 134 is in a range from about 0.5 nm to about 10 nm. In some embodiments as shown in FIG. 3D-2, the isolation film 134 has a rounding bottom profile. For example, the depth difference 134dr of opposite sides of the same isolation film 134 is in a range from about 0.5 nm to about 10 nm. In some embodiments, the depths of adjacent isolation films 134 and the depths of opposite sides of the same isolation film 134 are substantially the same.

In some embodiments as shown in FIG. 3D-2, the spacing 134s between the isolation films 134 and the bottom portion 138B of the contact structure 138 away from the sidewall of the trench 130 is in a range from about 0.5 nm to about 10 nm. In some embodiments as shown in FIG. 3D-2, the spacing 134ss between the isolation films 134 and the bottom portion 138B of the contact structure 138 near the sidewall of the trench 130 (near the dielectric of the first cap layer 122) is in a range from about 0.5 nm to about 10 nm. In some embodiments, the spacing 134s between the isolation films 134 and the bottom portion 138B of the contact structure 138 away from the sidewall of the trench 130 and the spacing 134ss between the isolation films 134 and the bottom portion 138B of the contact structure 138 near the sidewall of the trench 130 are substantially the same.

In some embodiments, the bottom thickness 136bTB of the second barrier layer 136b is in a range from about 0.1 nm to about 4 nm. In some embodiments, the sidewall thickness 136bTS of the second barrier layer 136b is in a range from about 0.1 nm to about 4 nm.

In some embodiments as shown in FIG. 3D-1, the bottom width 138BW of the bottom portion 138B of the contact structure 138 is in a range from about 2 nm to about 30 nm, and the bottom width 138TW of the top portion 138T of the contact structure 138 is in a range from about 2 nm to about 30 nm.

In some embodiments as shown in FIG. 3D-1, the height 138BH of the bottom portion 138B of the contact structure 138 is in a range from about 3 nm to about 50 nm, and the height 138TH of the top portion 138T of the contact structure 138 is in a range from about 3 nm to about 50 nm.

Figures 1, 3E:
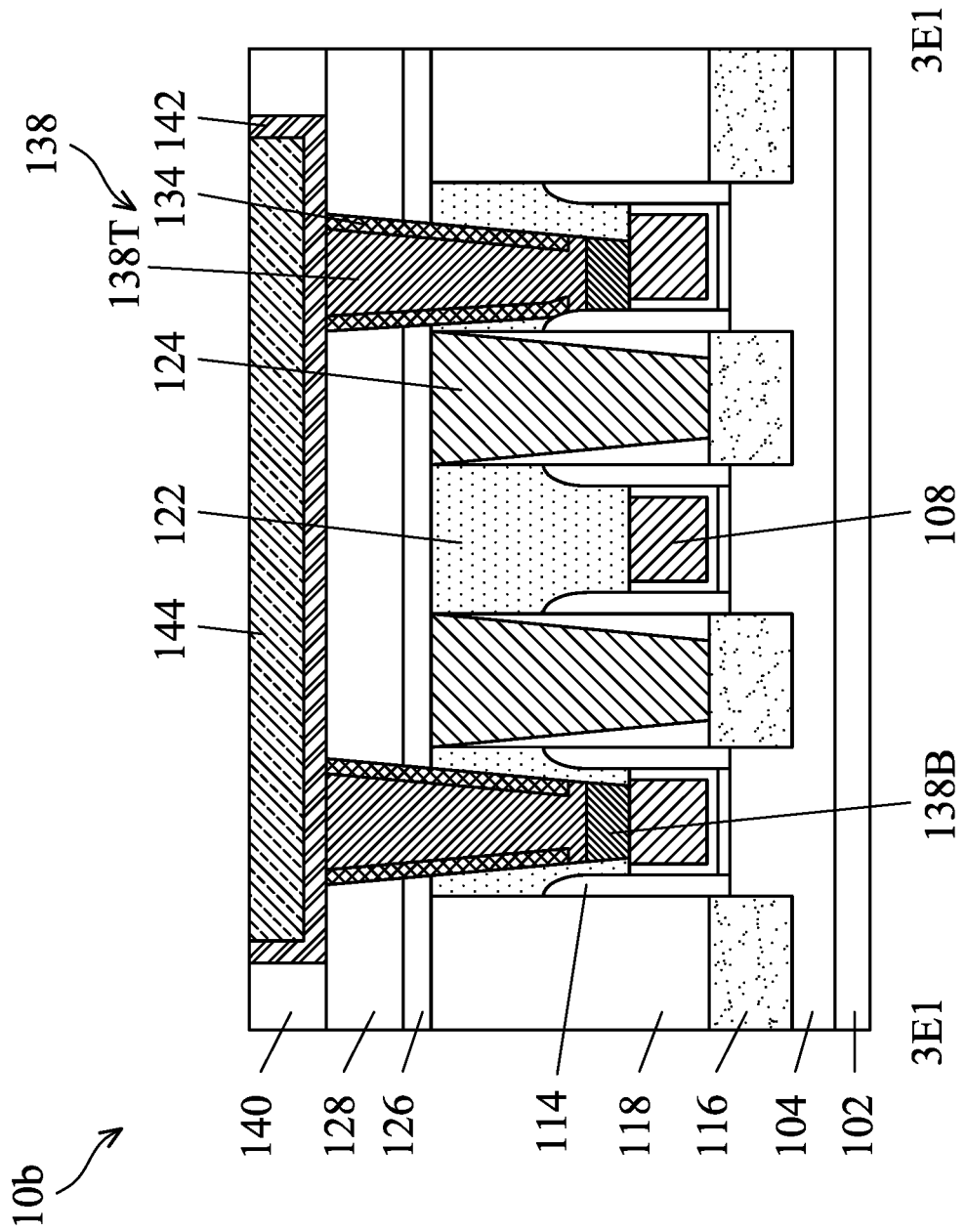
Figures 2, 3E:
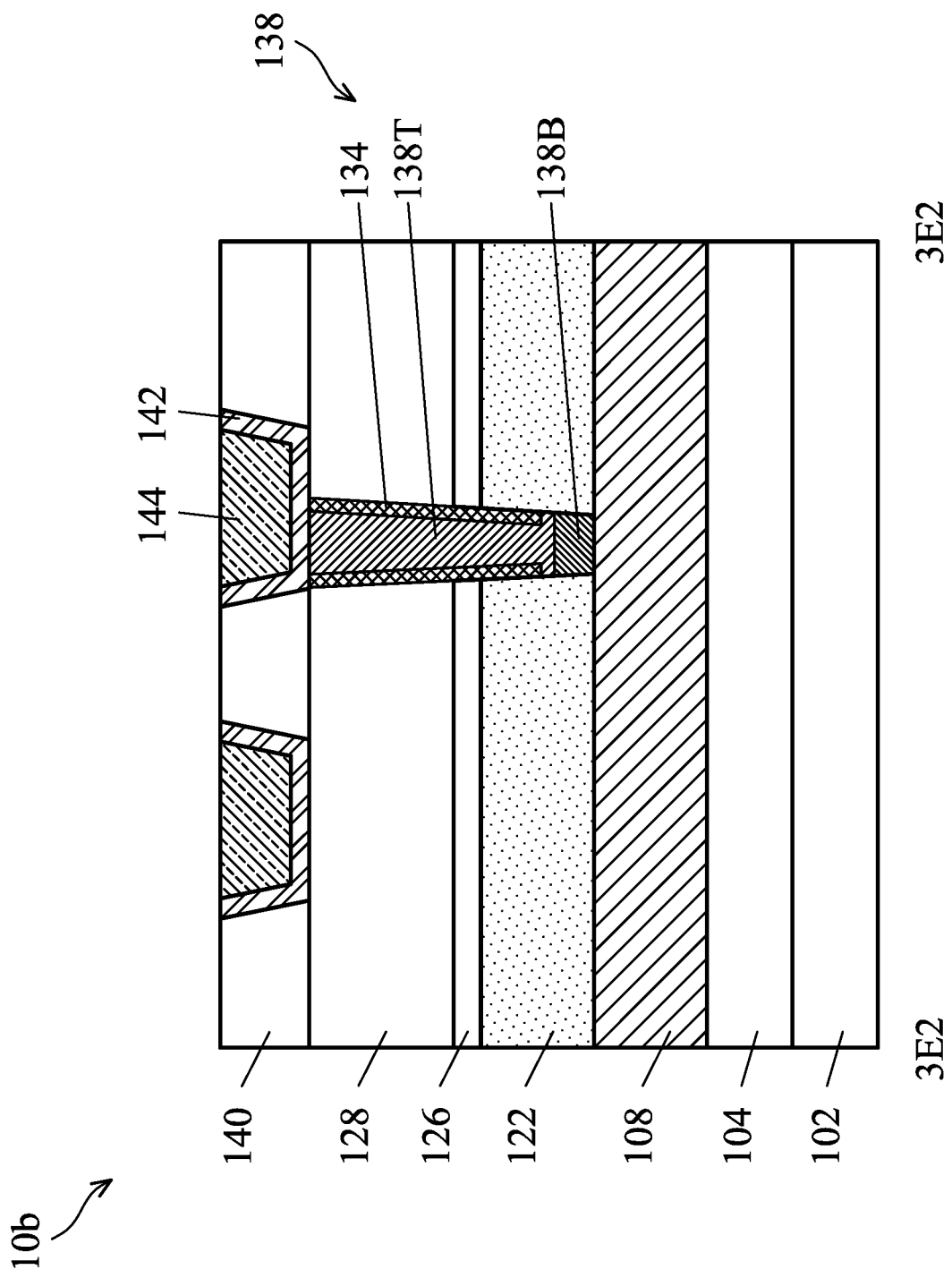
Figures 3, 3E:
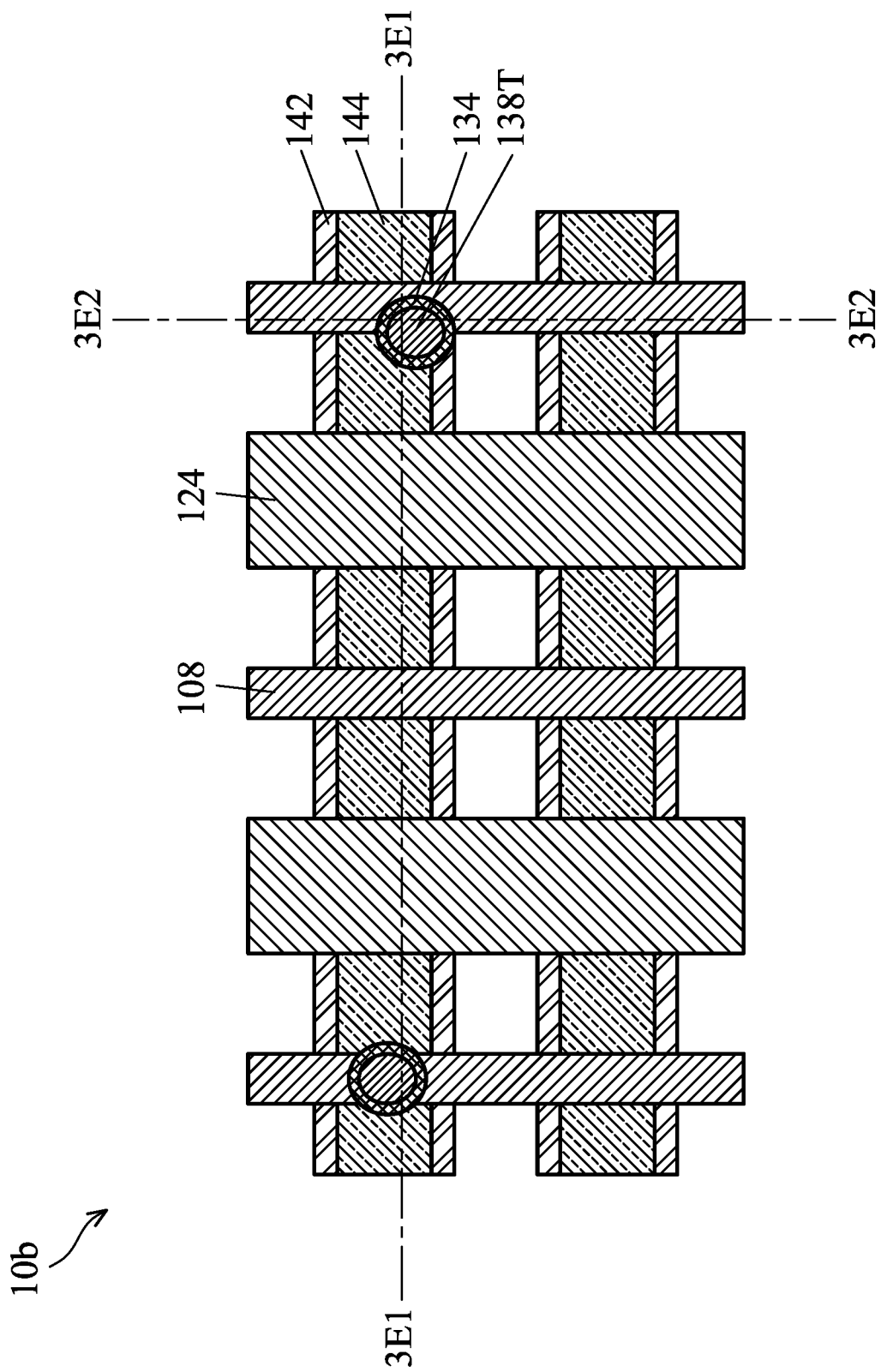

FIG. 3E-3 is a top view of a FinFET device structure 10b, in accordance with some embodiments of the disclosure. FIG. 3E-1 shows cross-sectional representations taken along line 3E1-3E1 in FIG. 3E-3 in accordance with some embodiments. FIG. 3E-2 shows cross-sectional representations taken along line 3E2-3E2 in FIG. 3E-3 in accordance with some embodiments.

Next, a mask layer 140, a glue layer 142, and a metal layer 144 are formed over the top portion 138T of the contact structure 138 as shown in FIGS. 3E-1 and 3E-2. The processes and materials for forming the mask layer 140, the glue layer 142, and the metal layer 144 may be the same as, or similar to, those used in the embodiment shown in FIGS. 2K-1 and 2K-2. For the purpose of brevity, the descriptions of these processes are not repeated herein.

As shown in FIGS. 3E-1, 3E-2, and 3E-3, the contact structure 138 including a top portion 138T and a bottom portion 138B may not aligned with the center of the beneath gate structure 108 or the above metal layer 144, which may increase leakage current between the contact structure 138 and its nearby conductive elements.

Forming the isolation film 134 over the sidewalls of the contact structure 138 may reduce leakage current and reliability failure between the contact structure 138 and its nearby conductive elements. In addition, the isolation film 134 is not formed over the top surface of the bottom portion 138B of the contact structure 138. Therefore, the contact structure 138 extends beneath the bottom surface of the isolation film 134 and the interface resistance may be maintained. Since the contact structure 138 includes a top portion 138T and a bottom portion 138B made of different materials, the metal diffusion between the contact structure 138 and the metal layer 144 above may be avoided. In addition, the deposition processes of forming the top portion 138T and the bottom portion 138B of the contact structure 138 may be different, therefore the quality of the contact structure 138 and the deposition rate may be maintained.

Figure 4:
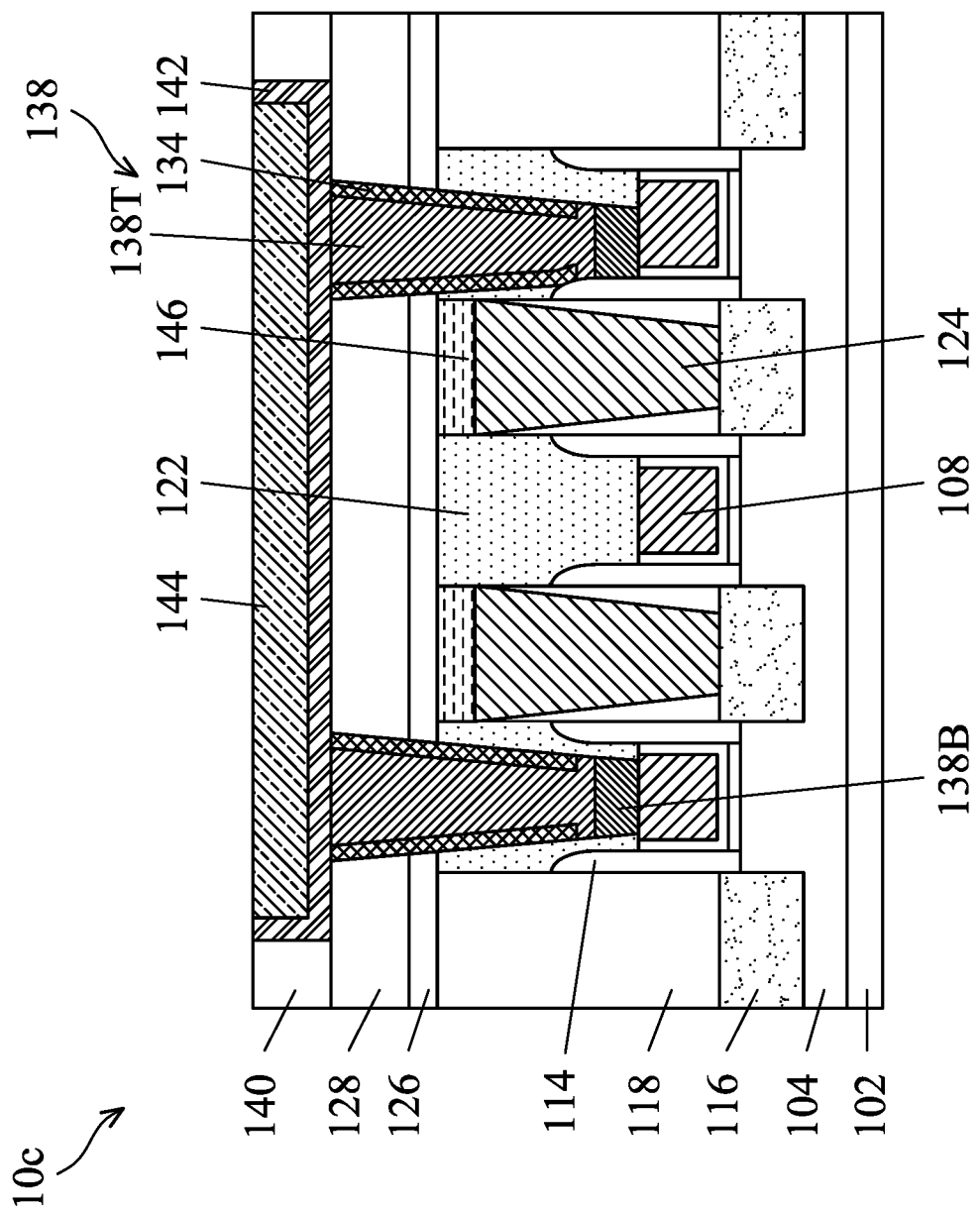
FIG. 4 is a cross-sectional representation of a modified FinFET device structure, in accordance with some embodiments of the disclosure.

Many variations and/or modifications may be made to the embodiments of the disclosure. FIG. 4 is a cross-sectional representation of a FinFET device structure 10c, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 4 in accordance with some embodiments, a second cap layer 146 is formed over the source/drain contact structure 124.

After forming the source/drain contact structure 124, the top portion of the source/drain contact structure 124 is removed to form a recess and a second cap layer 146 is formed in the recess over the source/drain contact structure 124, as shown in FIG. 4 in accordance with some embodiments. The second cap layer 146 may help to isolate the source/drain contact structure 124 and the contact structure 138.

The second cap layer 146 may include dielectric materials such as LaO, AlO, Si, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, other suitable material, or a combination thereof. In some embodiments, the second cap layer 146 and the first cap layer 122 are made of different materials. The processes for forming the second cap layer 146 may be the same as, or similar to, those used for forming the first cap layer 122. For the purpose of brevity, the descriptions of these processes are not repeated herein.

Forming the isolation film 134 over the sidewalls of the contact structure 138 may reduce leakage current and reliability failure between the contact structure 138 and its nearby conductive elements. In addition, the isolation film 134 is not formed over the top surface of the bottom portion 138B of the contact structure 138. Therefore, the contact structure 138 extends beneath the bottom surface of the isolation film 134 and the interface resistance may be maintained. Forming the second cap layer 146 over the source/drain contact structure 124 may improve isolation between the source/drain contact structure 124 and the contact structure 138.

Figure 5:
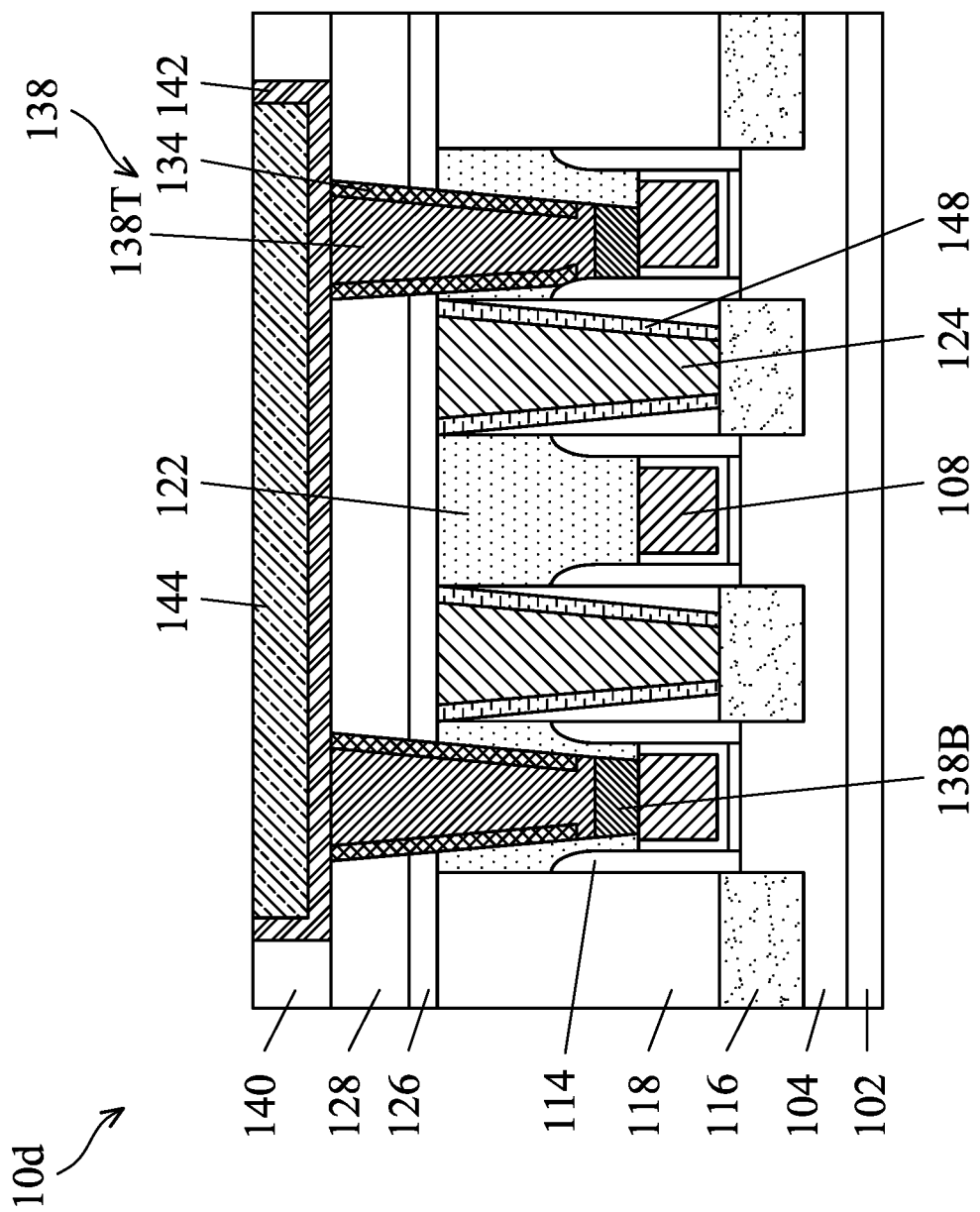
FIG. 5 is a cross-sectional representation of a modified FinFET device structure, in accordance with some embodiments of the disclosure.

Many variations and/or modifications may be made to the embodiments of the disclosure. FIG. 5 is a cross-sectional representation of a FinFET device structure 10d, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 5 in accordance with some embodiments, a liner layer 148 is formed over the sidewalls of the source/drain contact structure 124.

Before the conductive material of the source/drain contact structure 124 is deposited, the liner layer 148 is formed over the sidewalls of the trench, as shown in FIG. 5 in accordance with some embodiments. Afterwards, the material of the source/drain contact structure 124 may be filled in the trench. The liner layer 148 may help to prevent short-circuiting between the source/drain contact structure 124 and its nearby conductive elements. The liner layer 148 may be made of dielectric materials such as LaO, AlO, Si, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, other applicable materials, or a combination thereof. The liner layer 148 may be deposited in the trench by CVD (such as HDP-CVD, PECVD, or HARP), ALD, another suitable method, and/or a combination thereof. In some embodiments, the liner layer 148 and the first cap layer 122 are made of the same material.

Forming the isolation film 134 over the sidewalls of the contact structure 138 may reduce leakage current and reliability failure between the contact structure 138 and its nearby conductive elements. In addition, the isolation film 134 is not formed over the top surface of the bottom portion 138B of the contact structure 138. Therefore, the contact structure 138 extends beneath the bottom surface of the isolation film 134 and the interface resistance may be maintained. Forming a liner layer 148 over the sidewalls of the source/drain contact structure 124 may prevent short-circuiting between the source/drain contact structure 124 and its nearby conductive elements.

Figure 6:
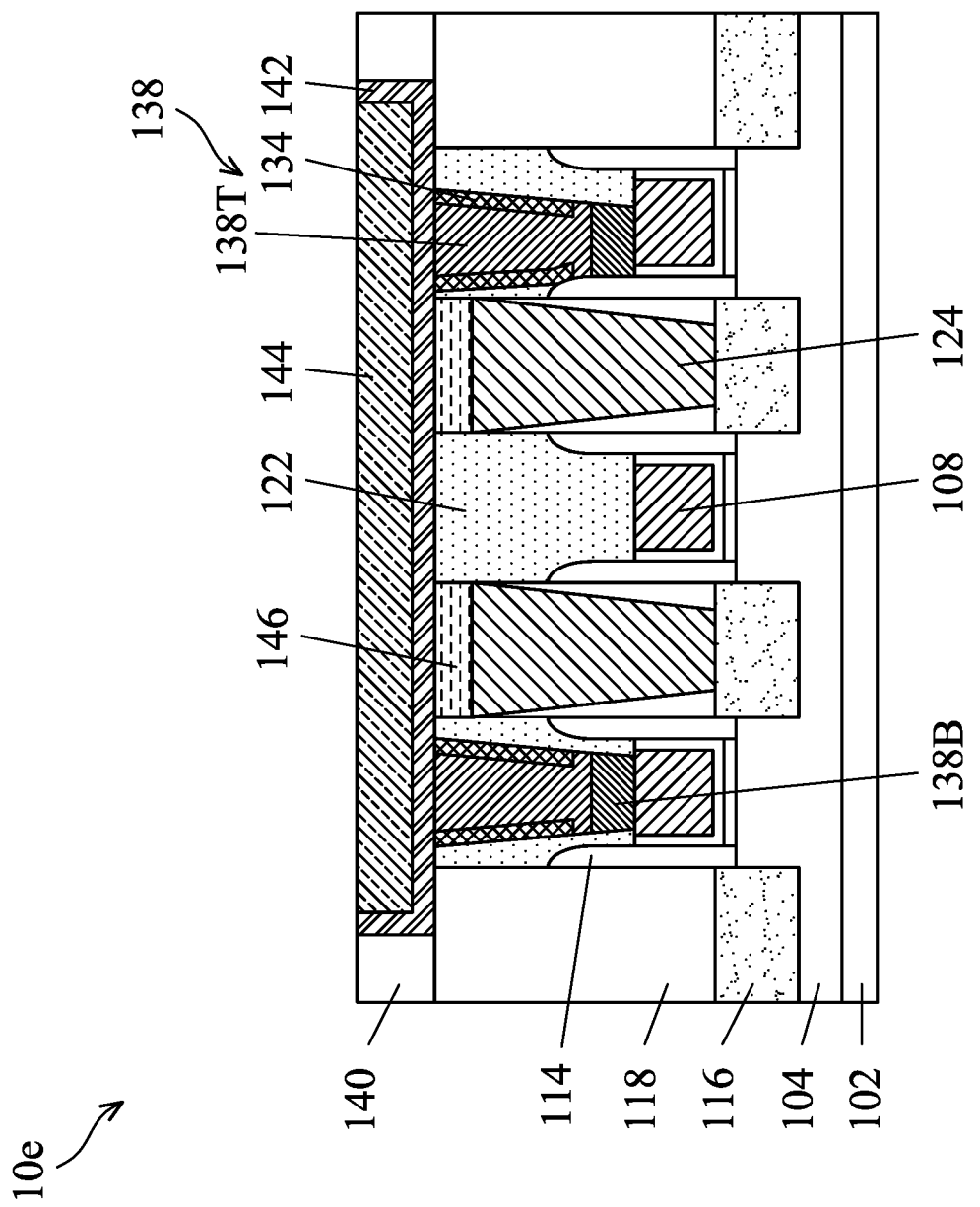
FIG. 6 is a cross-sectional representation of a modified FinFET device structure, in accordance with some embodiments of the disclosure.

Many variations and/or modifications may be made to the embodiments of the disclosure. FIG. 6 is a cross-sectional representation of a FinFET device structure 10e, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 6 in accordance with some embodiments, the mask layer 140, the glue layer 142, and the metal layer 144 are in contact with the first cap layer 122. In some embodiments, the glue layer 142 is optionally formed. Therefore, the metal layer 144 is in contact with the first cap layer 122.

As shown in FIG. 6, The mask layer 140, the glue layer 142, and the metal layer 144 are directly formed over the first ILD structure 118 without forming the etch stop layer 126 and the second ILD structure 128. Therefore, the production time and cost may be reduced.

Forming the isolation film 134 over the sidewalls of the contact structure 138 may reduce leakage current and reliability failure between the contact structure 138 and its nearby conductive elements. In addition, the isolation film 134 is not formed over the top surface of the bottom portion 138B of the contact structure 138. Therefore, the contact structure 138 extends beneath the bottom surface of the isolation film 134 and the interface resistance may be maintained. The mask layer 140, the glue layer 142, and the metal layer 144 being in contact with the first cap layer 122 may reduce the production time and cost.

Figure 7:
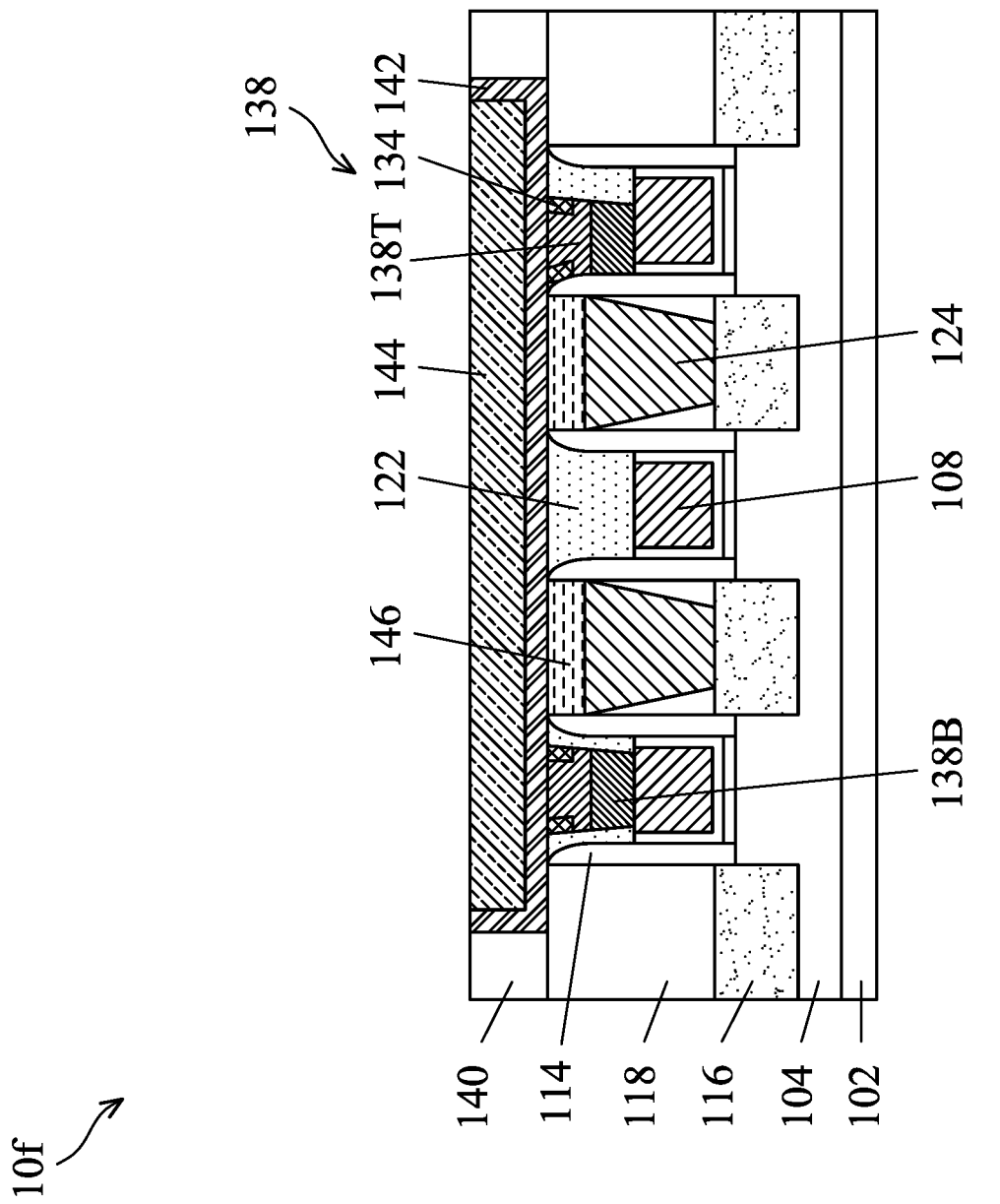
FIG. 7 is a cross-sectional representation of a modified FinFET device structure, in accordance with some embodiments of the disclosure.

Many variations and/or modifications may be made to the embodiments of the disclosure. FIG. 7 is a cross-sectional representation of a FinFET device structure 10f, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 7 in accordance with some embodiments, the mask layer 140, the glue layer 142, and the metal layer 144 are in contact with the top surface of the spacer 114. In some embodiments, the glue layer 142 is optionally formed. Therefore, the metal layer 144 is in contact with the top surface of the spacer 114.

After the cap layer 122 is formed, a planarization process is performed until the top surface of the spacer 114 is exposed. The mask layer 140, the glue layer 142, and the metal layer 144 are directly formed over the first ILD structure 118 later. Contact resistance may be reduced further by the contact structure 138 being shorter than the embodiments shown in FIG. 6.

Leakage current and reliability failure between the contact structure 138 and its nearby conductive elements may be reduced by forming the isolation film 134 over the sidewalls of the contact structure 138. In addition, the isolation film 134 is not formed over the top surface of the bottom portion 138B of the contact structure 138. Therefore, the contact structure 138 extends beneath the bottom surface of the isolation film 134 and the interface resistance may be maintained. The contact structure 138 may be shorter and the contact resistance may be reduced further due to the mask layer 140, the glue layer 142, and the metal layer 144 being in contact with the top surface of the spacer 114.

Figure 8:
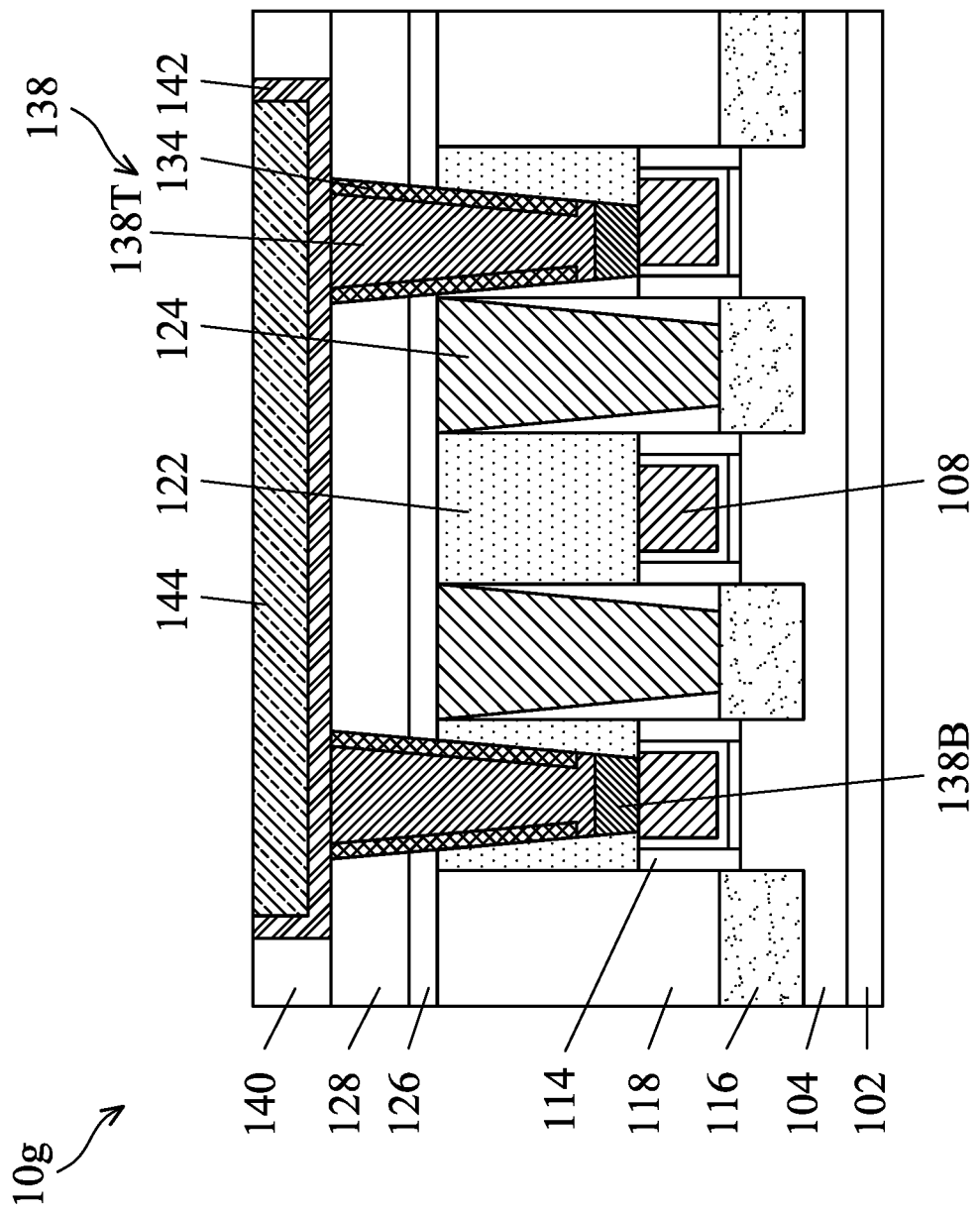
FIG. 8 is a cross-sectional representation of a modified FinFET device structure, in accordance with some embodiments of the disclosure.

Many variations and/or modifications may be made to the embodiments of the disclosure. FIG. 8 is a cross-sectional representation of a FinFET device structure 10g, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 8 in accordance with some embodiments, the top surface of the gate structure 108 is level with the top surface of the spacers 114.

After the trench 120 over the gate structure 108 is formed, the spacers 114 is further etched back until the top surface of the gate structure 108 is level with the top surface of the spacers 114. Afterwards, the first cap layer 122 is deposited over the gate structure 108. The wider first cap layer 122 may protect the spacer 114 while the contact structure 138 is being formed.

Forming the isolation film 134 over the sidewalls of the contact structure 138 may reduce leakage current and reliability failure between the contact structure 138 and its nearby conductive elements. In addition, the isolation film 134 is not formed over the top surface of the bottom portion 138B of the contact structure 138. Therefore, the contact structure 138 extends beneath the bottom surface of the isolation film 134 and the interface resistance may be maintained. The top surface of the gate structure 108 may be level with the top surface of the spacers 114 and a wider first cap layer 122 is formed. The wider first cap layer 122 may protect the spacer 114 while the contact structure 138 is being formed.

Figure 9:
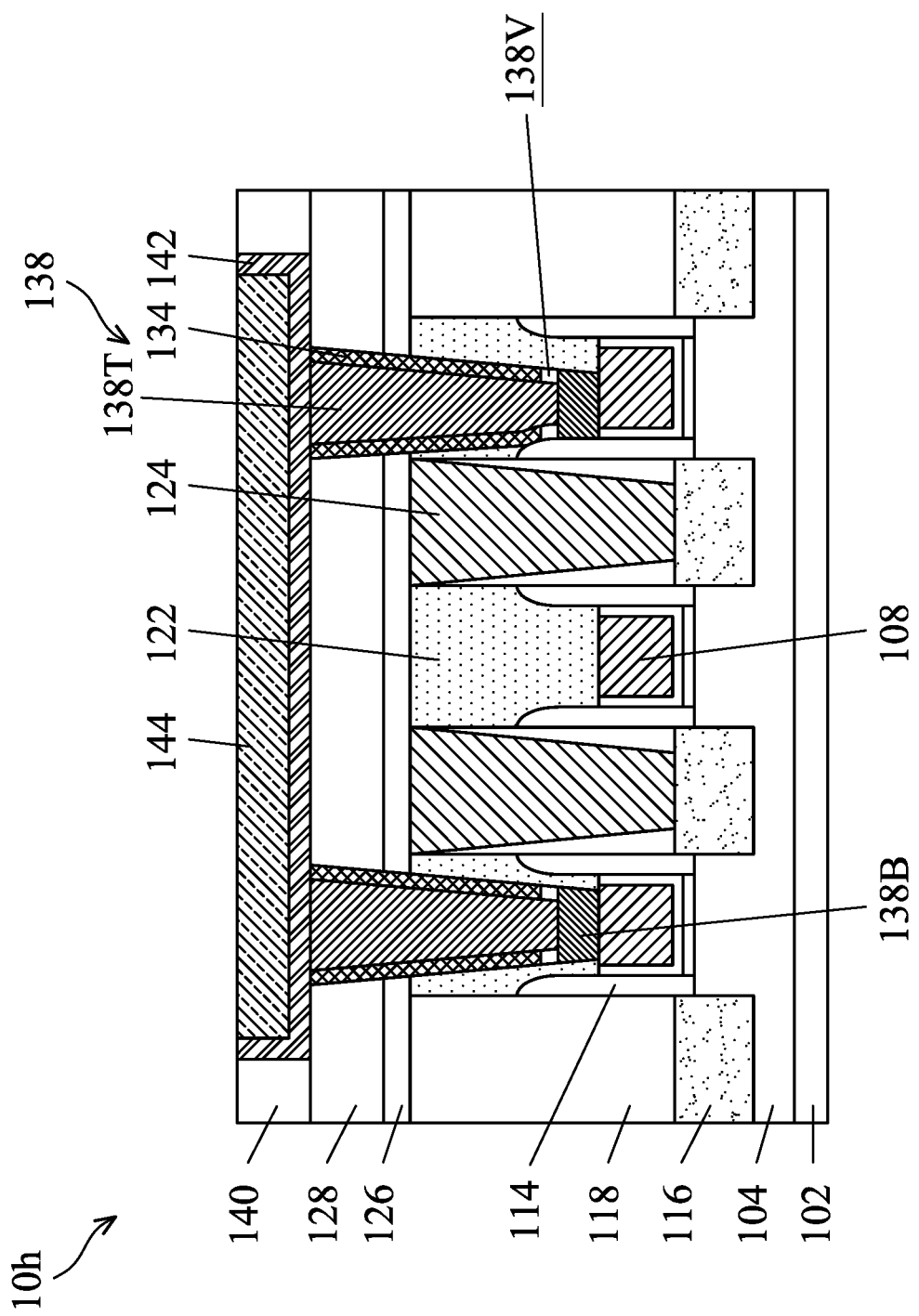
FIG. 9 is a cross-sectional representation of a modified FinFET device structure, in accordance with some embodiments of the disclosure.

Many variations and/or modifications may be made to the embodiments of the disclosure. FIG. 9 is a cross-sectional representation of a FinFET device structure 10h, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 9 in accordance with some embodiments, a void 138V is formed between the isolation film 134 and the bottom portion 138B of the contact structure. In some embodiments, the void 138V is formed between the isolation film 134 and the gate structure 108.

During formation of the contact structure 138, the conductive material of the contact structure 138 may not completely fill the space under the isolation film 134. Therefore, a void 138V is formed under the isolation film 134. The void 138V may also help to reduce leakage current from the contact structure 138 to nearby conductive elements.

Forming the isolation film 134 over the sidewalls of the contact structure 138 may reduce leakage current and reliability failure between the contact structure 138 and its nearby conductive elements. In addition, the isolation film 134 is not formed over the top surface of the bottom portion 138B of the contact structure 138. Therefore, the contact structure 138 extends beneath the bottom surface of the isolation film 134 and the interface resistance may be maintained. The void 138V formed beneath the isolation film 134 may help to reduce leakage current from the contact structure 138 to its nearby conductive elements.

It should be noted that, although in the embodiments shown in FIGS. 4-8 the contact structure 138 includes the top portion 138T and the bottom portion 138B, the contact structure 138 may also be a single contact structure 138 as shown in FIGS. 2J-1 and 2K-1, depending on the demands.

As described previously, the isolation film 134 formed over the sidewalls of the contact structure 138 may prevent leakage current and reliability failure between the contact structure 138 and its nearby conductive elements. The contact structure 138 has an extending portion beneath the bottom surface of the isolation film 134 and therefore the interface resistance may be maintained. In some embodiments as shown in FIG. 3E-1, the contact structure 138 includes a bottom portion 138B and a top portion 138T. Therefore, the metal diffusion between the contact structure 138 and the metal layer 144 above may be avoided. In addition, the quality and the deposition rate of the contact structure 138 may be maintained. In some embodiments as shown in FIG. 4, the second cap layer 146 is formed over the source/drain contact structure 124 and the isolation may be improved. In some embodiments as shown in FIG. 5, the liner layer 148 is formed over the source/drain contact structure 124 and short-circuiting between the source/drain contact structure 124 and its nearby conductive elements may be prevented. In some embodiments as shown in FIG. 6, the metal layer 144 is in contact with the first cap layer 122, and the production time and cost may be reduced. In some embodiments as shown in FIG. 7, the metal layer 144 is in contact with the top surface of the spacer 114, and the contact resistance may be further reduced. In some embodiments as shown in FIG. 8, the first cap layer 122 is wider, and the spacer 114 may be protected during the formation of the contact structure 138. In some embodiments as shown in FIG. 9, the void 138V is formed beneath the isolation film 134, and leakage current from the contact structure 138 to nearby conductive elements may be reduced.

Embodiments of a FinFET device structure and a method for forming the same are provided. The method for forming the FinFET device structure may include forming an isolation film over the sidewalls of the contact structure over the gate structure. The leakage current and reliability failure between the contact structure and its nearby conductive elements may be reduced. In addition, the contact structure extends under the isolation film. Therefore, the interface resistance may remain.

In some embodiments, a fin field effect transistor device structure is provided. A fin field effect transistor device structure includes a fin structure formed over a substrate. The fin field effect transistor device structure also includes a gate structure formed across the fin structure. The fin field effect transistor device structure also includes a cap layer formed over the gate structure. The fin field effect transistor device structure also includes a contact structure formed over the gate structure penetrating through the cap layer. The fin field effect transistor device structure also includes an isolation film formed over sidewalls of the contact structure. The isolation film is separated from the gate structure, and the bottom surface of the isolation film is below the top surface of the cap layer.

In some embodiments, a fin field effect transistor device structure is provided. A fin field effect transistor device structure includes a fin structure formed over a substrate. The fin field effect transistor device structure also includes a source/drain epitaxial structure formed over the fin structure. The fin field effect transistor device structure also includes a gate structure formed across the fin structure. The fin field effect transistor device structure also includes spacers formed over opposite sides of the gate structure. The fin field effect transistor device structure also includes a first cap layer formed over the gate structure. The fin field effect transistor device structure also includes a first contact structure formed over the gate structure through the first cap layer. The fin field effect transistor device structure also includes an isolation film formed over sidewalls of the first contact structure. The first contact structure has an extending portion beneath the bottom surface of the isolation film.

In some embodiments, a method for forming a fin field effect transistor device structure is provided. The method for forming a fin field effect transistor device structure includes forming a fin structure over a substrate. The method for forming a fin field effect transistor device structure also includes forming a gate structure across the fin structure. The method for forming a fin field effect transistor device structure also includes forming a cap layer over the gate structure. The method for forming a fin field effect transistor device structure also includes depositing an etch stop layer and a dielectric layer over the cap layer. The method for forming a fin field effect transistor device structure also includes patterning and etching the dielectric layer, the etch stop layer, and the cap layer over the gate structure to form a first trench over the gate structure. The method for forming a fin field effect transistor device structure also includes depositing an isolation film over the sidewalls of the first trench. The method for forming a fin field effect transistor device structure also includes filling a first conductive material in the first trench to form a contact structure. The bottom surface of the isolation film is higher than the top surface of the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor device structure, comprising:
a fin structure formed over a substrate;
a gate structure formed across the fin structure;
a cap layer formed over the gate structure;
a contact structure formed over the gate structure penetrating through the cap layer; and
an isolation film formed over sidewalls of the contact structure,
wherein the isolation film is separated from the gate structure, and a bottom surface of the isolation film is below a top surface of the cap layer, wherein the isolation film is in contact with both the cap layer and the contact structure.

2. The fin field effect transistor device structure as claimed in claim 1, wherein the bottom surface of the isolation film is between a top surface of the gate structure and the top surface of the cap layer.

3. The fin field effect transistor device structure as claimed in claim 1, wherein the contact structure comprises a bottom portion and a top portion, wherein the isolation film is separated from the bottom portion of the contact structure.

4. The fin field effect transistor device structure as claimed in claim 3, wherein the bottom portion of the contact structure and the top portion of the contact structure are made of different materials.

5. The fin field effect transistor device structure as claimed in claim 3, further comprising:
a barrier layer formed over sidewalls of the top portion of the contact structure and a top surface of the bottom portion of the contact structure.

6. The fin field effect transistor device structure as claimed in claim 1, wherein the isolation film comprises LaO, AlO, Si, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, or a combination thereof.

7. The fin field effect transistor device structure as claimed in claim 1, wherein a void is formed between the isolation film and the gate structure.

8. The fin field effect transistor device structure as claimed in claim 1, wherein a bottom surface of the contact structure is smaller than a top surface of the gate structure.

9. A fin field effect transistor device structure, comprising:
a fin structure formed over a substrate;
a source/drain epitaxial structure formed over the fin structure;
a gate structure formed across the fin structure;
spacers formed over opposite sides of the gate structure;
a first cap layer formed over the gate structure;
a first contact structure formed over the gate structure and through the first cap layer; and
an isolation film formed over sidewalls of the first contact structure,
wherein the first contact structure has an extending portion beneath a bottom surface of the isolation film, wherein the extending portion is in direct contact with the bottom surface of the isolation film.

10. The fin field effect transistor device structure as claimed in claim 9, wherein the first contact structure is in contact with the spacers.

11. The fin field effect transistor device structure as claimed in claim 9, further comprising:
a second contact structure formed over the source/drain epitaxial structure; and
a second cap layer formed over the second contact structure.

12. The fin field effect transistor device structure as claimed in claim 9, further comprising:
a second contact structure formed over the source/drain epitaxial structure; and
a liner layer formed over sidewalls of the second contact structure.

13. The fin field effect transistor device structure as claimed in claim 9, further comprising:
a metal layer formed over the first contact structure,
wherein the metal layer is in contact with the first cap layer.

14. The fin field effect transistor device structure as claimed in claim 13, wherein the metal layer is in contact with a top surface of the spacers.

15. The fin field effect transistor device structure as claimed in claim 9, wherein a top surface of the gate structure is level with a top surface of the spacers.

16. A fin field effect transistor device structure, comprising:
a fin structure formed over a substrate;
a gate structure formed across the fin structure;
spacers formed over opposite sides of the gate structure;
a cap layer formed over the gate structure;
a contact structure formed over the gate structure and in contact with the gate structure;
isolation films formed over sidewalls of the contact structure; and
a barrier layer formed over the sidewalls and a bottom surface of the contact structure,
wherein a bottom surface of the isolation films is higher than a top surface of the gate structure, wherein the barrier layer under the contact structure is thinner than the barrier layer under the isolation films.

17. The fin field effect transistor device structure as claimed in claim 16, wherein one of the isolation films is in contact with one of the spacers.

18. The fin field effect transistor device structure as claimed in claim 16, wherein the barrier layer is in contact with one of the spacers.

19. The fin field effect transistor device structure as claimed in claim 16, wherein each of the isolation films has a rounding bottom profile.

20. The fin field effect transistor device structure as claimed in claim 16, wherein the isolation films over opposite sidewalls of the contact structure have a depth difference.

* * * * *